(12) United States Patent
Kato

(10) Patent No.: US 8,368,441 B2
(45) Date of Patent: Feb. 5, 2013

(54) SEMICONDUCTOR INTEGRATED CIRCUIT HAVING AN ON-CHIP PLL AND OPERATING METHOD THEREOF

(75) Inventor: Takahiro Kato, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/358,204

(22) Filed: Jan. 25, 2012

(65) Prior Publication Data

US 2012/0242384 A1 Sep. 27, 2012

(30) Foreign Application Priority Data

Mar. 25, 2011 (JP) ................................ 2011-067266

(51) Int. Cl.
*H03L 7/06* (2006.01)
(52) U.S. Cl. ........ 327/156; 327/147; 327/148; 327/149; 327/157; 327/158
(58) Field of Classification Search .......... 327/147–149, 327/156–158
See application file for complete search history.

(56) References Cited

U.S. PATENT DOCUMENTS

| 7,268,631 | B2 | 9/2007 | Wilson | |
|---|---|---|---|---|
| 7,777,539 | B2 * | 8/2010 | Asano | 327/149 |
| 7,859,345 | B2 | 12/2010 | Kawamoto | |
| 8,159,276 | B2 * | 4/2012 | Mehas et al. | 327/158 |
| 2005/0013310 | A1 * | 1/2005 | Banker et al. | 370/401 |
| 2005/0073589 | A1 * | 4/2005 | Wakito | 348/207.99 |
| 2009/0167379 | A1 * | 7/2009 | Mobin et al. | 327/149 |
| 2009/0195287 | A1 * | 8/2009 | Ho et al. | 327/298 |
| 2010/0237915 | A1 * | 9/2010 | Mobin et al. | 327/149 |
| 2011/0074514 | A1 * | 3/2011 | Marutani | 331/1 R |

FOREIGN PATENT DOCUMENTS

| JP | S62-40827 | 2/1987 |
|---|---|---|
| JP | 10-233682 | 9/1998 |

* cited by examiner

*Primary Examiner* — Adam Houston
(74) *Attorney, Agent, or Firm* — Womble Carlyle

(57) ABSTRACT

An on-chip phase-locked loop circuit has reduced power consumption in a semiconductor integrated circuit. The phase locked loop circuit is equipped with a phase frequency comparator, a loop attenuator, a charge pump, a loop filter, a voltage controlled oscillator and a divider. The attenuator includes a sampling circuit and a counter. A sampling pulse and first and second output signals both outputted from the phase frequency comparator are supplied to the sampling circuit. The sampling circuit outputs a sampling output signal. When the counter completes a countup of a predetermined number of sampling pulses outputted from the sampling circuit, the counter outputs a countup completion output signal. The charge pump outputs a charging current or a discharging current to the loop filter in response to the countup completion output signal.

25 Claims, 11 Drawing Sheets

SEMICONDUCTOR INTEGRATED CIRCUIT HAVING AN ON-CHIP PLL AND OPERATING METHOD THEREOF

CROSS-REFERENCE TO RELATED APPLICATIONS

The disclosure of Japanese Patent Application No. 2011-67266 filed on Mar. 25, 2011 including the specification, drawings and abstract is incorporated herein by reference in its entirety.

BACKGROUND

The present invention relates to a semiconductor integrated circuit having a phase locked loop (PLL) circuit built therein and an operating method thereof, and particularly to a technology useful in, when a loop filter is on-chipped in particular, reducing variations in the characteristics of the PLL circuit due to variations in the device size of each transistor and reducing increases in both circuit scale and power consumption of the semiconductor integrated circuit.

A phase locked loop (PLL) circuit has heretofore been mounted in a semiconductor integrated circuit. This PLL circuit generates a clock signal for operating a logic circuit such as a large-scale logic integrated circuit or the like.

The following patent documents 1 and 2 respectively have described that in order to on-chip a loop filter of a PLL circuit, a main charge pump circuit and a subsidiary charge pump circuit are coupled between a phase output terminal of a phase comparator and an input terminal of the loop filter. In the PLL circuit described in the following patent document 1, the main charge pump circuit and the subsidiary charge pump carry out charging and discharging operations based on outputs being in-phase to each other in response to a phase output signal of the phase comparator. The output of the subsidiary charge pump circuit is coupled to the input of a voltage-current converter of the loop filter. On the other hand, the output of the main charge pump circuit is coupled to the output of the voltage-current converter of the loop filter. In the PLL described in the following patent document 2, a main charge pump circuit and a subsidiary charge pump circuit perform charging and discharging operations based on outputs being in antiphase to each other in response to a phase output signal of the phase comparator. The output of the main charge pump circuit is coupled to one end of a resistor of the loop filter. On the other hand, the output of the subsidiary charge pump circuit is coupled to the other end of the resistor of the loop filter, and a filter capacitor is coupled between the other end of the resistor and a ground potential.

The following patent document 3 has described that in order to reduce the area of a charge pump PLL circuit, one component of an integrated voltage of a loop filter voltage is subtracted from the total loop filter voltage using a current mirror circuit.

The following patent document 4 has described that in order to bring a loop filter of a phase lock oscillator circuit into highly integrated circuitry for the purpose of its miniaturization, a digital circuit comprised of a counter, a decoder and an updown counter converts a pulse width of a charge signal or a discharge signal outputted from a phase detection circuit into a digital signal, and a D/A convertor converts the digital signal into an analog signal and supplies the analog signal to a voltage controlled oscillator in a manner similar to an analog voltage outputted from the loop filter.

PRIOR ART DOCUMENTS

Patent Documents

[Patent Document 1] Japanese Patent Laid-Open No. Hei 10 (1998)-233682
[Patent Document 2] Japanese Patent Laid-Open No. 2009-152910
[Patent Document 3] Japanese Patent Laid-Open No. 2007-43712
[Patent Document 4] Japanese Patent Laid-Open No. Sho 62 (1987)-40827

Prior to the present invention, the present inventors were involved in the development of an optical disc recording/reproducing semiconductor integrated circuit capable of carrying out a write operation (recording operation) and a read operation (reproducing operation) of an optical disc such as a CD (Compact Disc), a BD (Blu-Ray Disc) or the like. Since the optical disc recording/reproducing semiconductor integrated circuit needs a reproduction clock of a frequency of 16 MHz for quadruple-speed reproduction of the CD and a reproduction clock of a frequency of 1,056 MHz for 16× reproduction of the BD, the operating frequency range of a PLL circuit becomes wide. On the other hand, there are known an analog PLL and a digital PLL as the PLL circuits. In the general analog PLL, however, a loop filter encounters a difficulty in on-chipping on a semiconductor integrated circuit. On the other hand, the digital PLL involves a problem that a digital loop filter is easy to be on-chipped on a semiconductor integrated circuit but a D/A converter is needed, so that the circuit scale and power consumption of the semiconductor integrated circuit will increase.

In order to on-chip the loop filter of the PLL circuit, the present inventors have studied in detail the system described in the above patent document 2, the system described in the above patent document 3 and the system described in the above patent document 4 prior to the present invention.

In the system described in the above patent document 2, a main charge pump charging/discharging current of the main charge pump circuit is set to 100 µA, and a subsidiary charge pump charging/discharging current of the subsidiary charge pump circuit is set to 80 µA. The filter capacitor of the loop filter is charged/discharged by a difference current of 20 µA that corresponds to the difference between the two. However, a current value of the main charge pump charging/discharging current and a current value of the subsidiary charge pump charging/discharging current have variations depending upon the device size of each MOS transistor of the main charge pump circuit and the device size of each MOS transistor of the subsidiary charge pump circuit. In particular, relative variations in the device size of each MOS transistor increase depending on a miniaturized semiconductor manufacturing process and thereby the difference current for charging/discharging the filter capacitor of the loop filter shows a variation. Further, since the smaller the difference current causes the rate of variation in current to be highly visible, the problem of increasing the variations in the characteristics of the PLL circuit has been revealed by the study of the present inventors et al prior to the present invention.

In the system described in the patent document 3, the problem that since the current mirror circuit is used in the PLL circuit, the device size of each MOS transistor that configures the current mirror circuit shows variations, so that variations in the characteristics of the PLL circuit will increase has been revealed by the study of the present inventors et al prior to the present invention.

In the system described in the patent document 4, the problem that since the D/A converter is used in the PLL circuit, the circuit scale and power consumption of a semiconductor integrated circuit will increase has been revealed by the study of the present inventors et al prior to the present invention.

SUMMARY

The present invention has been achieved as a result of the above studies conducted by the present inventors et al prior to the present invention.

An object of the present invention is therefore to, when a loop filter of a PLL circuit is on-chipped, reduce variations in the characteristics of the PLL circuit due to variations in the device size of each transistor and reduce increases in both circuit scale and power consumption of a semiconductor integrated circuit.

The above and other objects and novel features of the present invention will be apparent from the description of the present specification and the accompanying drawings.

A typical one of the inventive aspects of the invention disclosed in the present application will be briefly described as follows:

A semiconductor integrated circuit according to a typical embodiments of the present invention has a phase locked loop circuit built therein which is equipped with a phase frequency comparator (1), a loop attenuator (2), a charge pump (3), a loop filter (4), a voltage controlled oscillator (5), and a divider (6).

The phase frequency comparator compares a difference in phase between a reference signal (8) and a feedback signal (9) that is an output signal of the divider and outputs a first output signal (11) and a second output signal (12) each used as a phase-compared output signal.

The loop attenuator outputs a charge pump drive output signal supplied to the charge pump in response to the first output signal and the second output signal each used as the phase-compared output signal both outputted from the phase frequency comparator.

The charge pump outputs a charging current or a discharging current to the loop filter in response to the charge pump drive output signal outputted from the loop attenuator.

The loop filter outputs a control voltage (Vc) supplied to the voltage controlled oscillator in response to the charging current or the discharging current outputted from the charge pump.

The voltage controlled oscillator outputs an oscillation output signal (16) supplied to the divider in response to the control voltage outputted from the loop filter.

The divider divides the oscillation output signal outputted from the voltage controlled oscillator to thereby output the feedback signal supplied to the phase frequency comparator.

When the phase of the feedback signal (9) lags the phase of the reference signal (8), a difference in pulse width between a first pulse (UP) having a long pulse width, of the first output signal (11) and a second pulse (DN) having a short pulse width, of the second output signal (12) corresponds to the lag in the phase between the reference signal (8) and the feedback signal (9).

The loop attenuator (2) includes at least a sampling circuit (21) and a counter (22).

The sampling circuit is supplied with a sampling pulse (SPL_CLK) and the first output signal and the second output signal outputted from the phase frequency comparator, whereby the sampling circuit outputs a sampling output signal.

When the phase of the feedback signal lags the phase of the reference signal, the sampling circuit outputs, as the sampling output signal, the sampling pulses supplied during a period of the pulse width of the first pulse in the first output signal outputted from the phase frequency comparator.

When the counter completes a countup of a predetermined number of the sampling pulses outputted as the sampling output signal from the sampling circuit, the counter outputs a countup completion output signal.

The charge pump outputs the charging current or the discharging current to the loop filter in response to the countup completion output signal outputted from the counter of the loop attenuator (refer to FIGS. 1 and 2).

Advantageous effects obtained by a typical one of the invention disclosed in the present application will be briefly explained as follows:

According to the present invention, when a loop filter of a PLL circuit is on-chipped, variations in the characteristics of the PLL circuit due to variations in the device size of each transistor can be reduced, and increases in both circuit scale and power consumption of a semiconductor integrated circuit can be reduced.

DETAILED DESCRIPTION

1. Summary of the Embodiments

Figure 1:
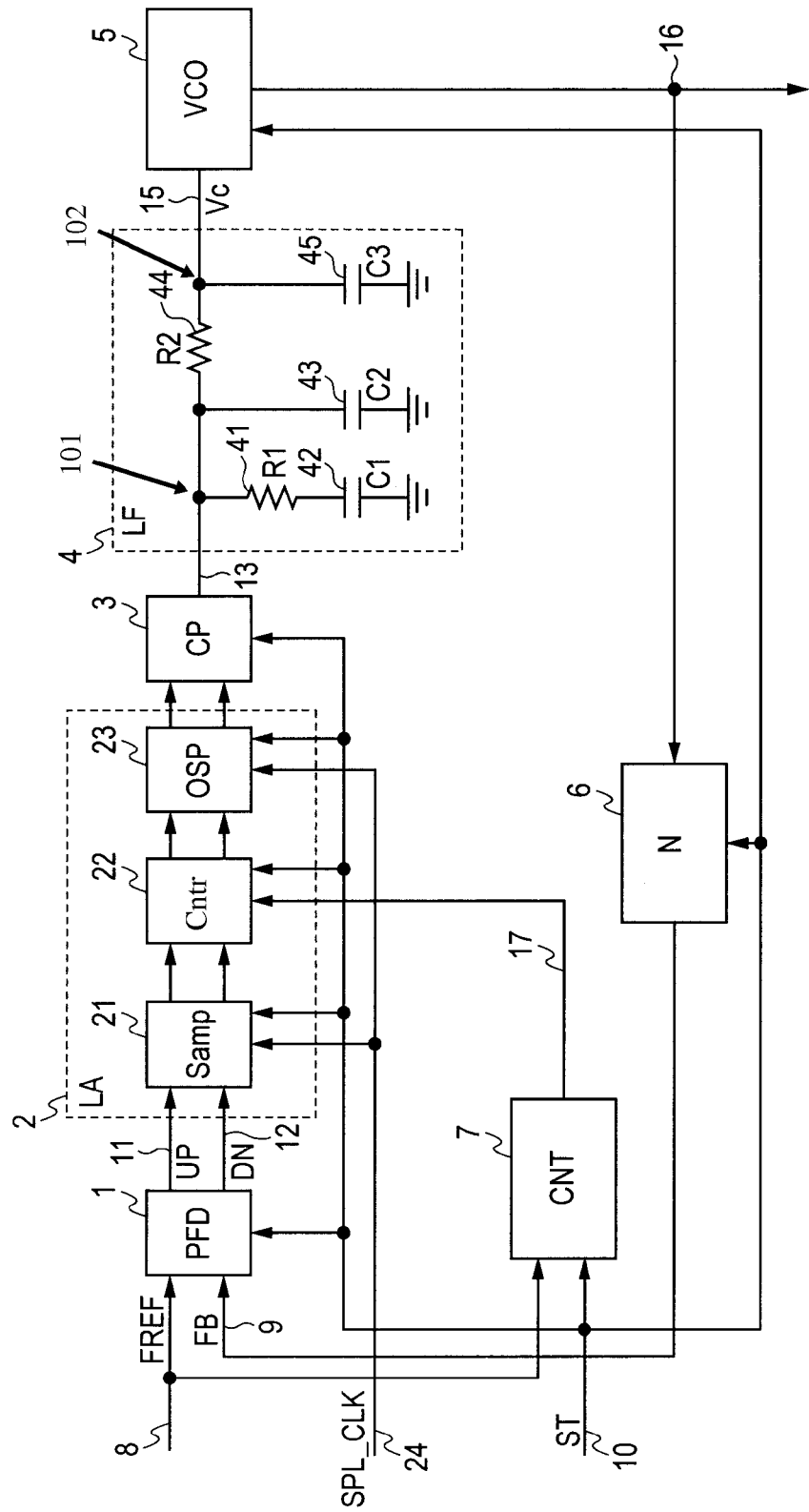
FIG. 1 is a diagram for describing a configuration of a PLL circuit on-chip integrated into a semiconductor integrated circuit according to a first embodiment of the present invention.

A summary of typical embodiments of the invention disclosed in the present application will first be explained. Reference numerals of the accompanying drawings referred to with parentheses in the description of the summary of the typical embodiments only illustrate elements included in the concept of components to which the reference numerals are given.

[1] A semiconductor integrated circuit according to a typical embodiment of the present invention has a phase locked loop circuit built therein, which is equipped with a phase frequency comparator (1), a loop attenuator (2), a charge pump (3), a loop filter (4), a voltage controlled oscillator (5), and a divider (6).

The phase frequency comparator compares a difference in phase between a reference signal (8) and a feedback signal (9) that is an output signal of the divider and outputs a first output signal (11) and a second output signal (12) each used as a phase-compared output signal.

The loop attenuator (2) outputs a charge pump drive output signal supplied to the charge pump in response to the first output signal and the second output signal each used as the phase-compared output signal outputted from the phase frequency comparator.

The charge pump (3) outputs a charging current or a discharging current to the loop filter in response to the charge pump drive output signal outputted from the loop attenuator.

The loop filter (4) outputs a control voltage (Vc) supplied to the voltage controlled oscillator in response to the charging current or the discharging current outputted from the charge pump.

The voltage controlled oscillator (5) outputs an oscillation output signal (16) supplied to the divider in response to the control voltage outputted from the loop filter.

The divider (6) divides the oscillation output signal outputted from the voltage controlled oscillator to thereby output the feedback signal supplied to the phase frequency comparator.

When the phase of the feedback signal (9) lags the phase of the reference signal (8), a difference in pulse width between a first pulse (UP) having a long pulse width, of the first output signal (11) and a second pulse (DN) having a short pulse width, of the second output signal (12) corresponds to the lag in the phase between the reference signal (8) and the feedback signal (9).

The loop attenuator (2) includes at least a sampling circuit (21) and a counter (22).

The sampling circuit is supplied with a sampling pulse (SPL_CLK) and the first output signal and the second output signal outputted from the phase frequency comparator to thereby output a sampling output signal.

When the phase of the feedback signal lags the phase of the reference signal, the sampling circuit outputs, as the sampling output signal, the sampling pulses supplied during a period of the pulse width of the first pulse of the first output signal outputted from the phase frequency comparator.

When the counter (22) completes a countup of a predetermined number of the sampling pulses outputted as the sampling output signal from the sampling circuit, the counter outputs a countup completion output signal.

Figure 2:
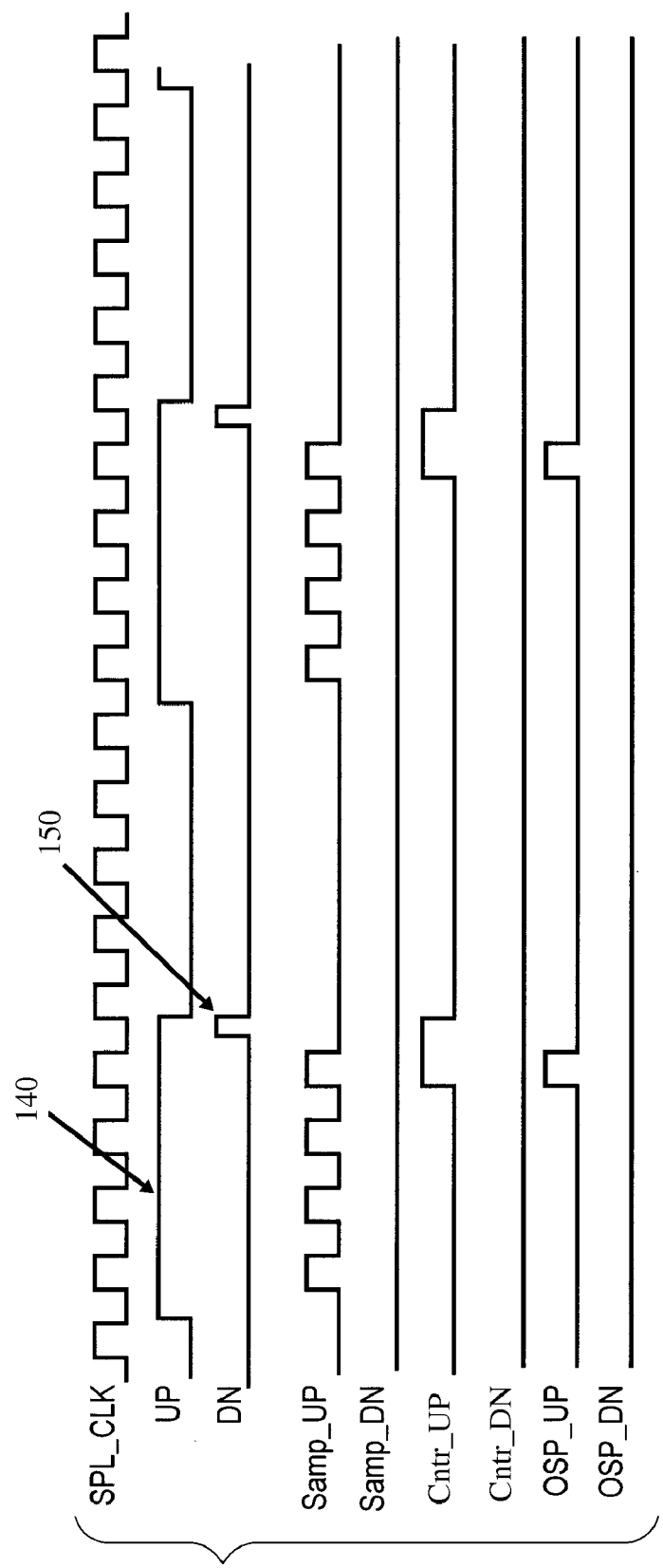
FIG. 2 is a diagram showing waveforms of respective parts in the PLL circuit during a period in which the PLL circuit shown in FIG. 1 executes a steady lock operation.

The charge pump (3) outputs the charging current or the discharging current to the loop filter in response to the countup completion output signal outputted from the counter of the loop attenuator (refer to FIGS. 1 and 2).

According to the embodiment, when the loop filter of the PLL circuit is on-chipped, it is possible to reduce variations in the characteristics of the PLL circuit due to variations in the device size of each transistor and reduce increases in both circuit scale and power consumption of the semiconductor integrated circuit.

In a preferred embodiment, the counter (22) is reset in response to the completion of the countup of the predetermined number of sampling pulses by the counter and the output of the countup completion output signal thereby. Thus, the reset counter starts again the countup of the sampling pulses outputted as the sampling output signal from the sampling circuit (refer to FIGS. 1 and 2).

In another preferred embodiment, the loop attenuator further includes a one-shot pulse generator (23).

The one-shot pulse generator (23) is supplied with the sampling pulse and the countup completion output signal outputted from the counter. Thus, the one-shot pulse generator outputs a one-shot pulse output signal (OSP_UP) having a pulse width approximately equal to that of the sampling pulse as the charge pump drive output signal (refer to FIGS. 1 and 2).

In a further preferred embodiment, the one-shot pulse generator is comprised of a first flip-flop (FF1), a second flip-flop (FF2), an inverter (Inv1), an exclusive-OR circuit (EX-OR) and an AND circuit (AND).

The countup completion output signal outputted from the counter is supplied to a data input terminal of the first flip-flop and a data input terminal of the second flip-flop. The sampling pulse is supplied to a clock input terminal of the first flip-flop and an input terminal of the inverter.

An inverted sampling pulse outputted from an output terminal of the inverter is supplied to a clock input terminal of the second flip-flop. Output data of the first flip-flop and output data Q2 of the second flip-flop are respectively supplied to first and second input terminals of the exclusive-OR circuit.

Figure 7:
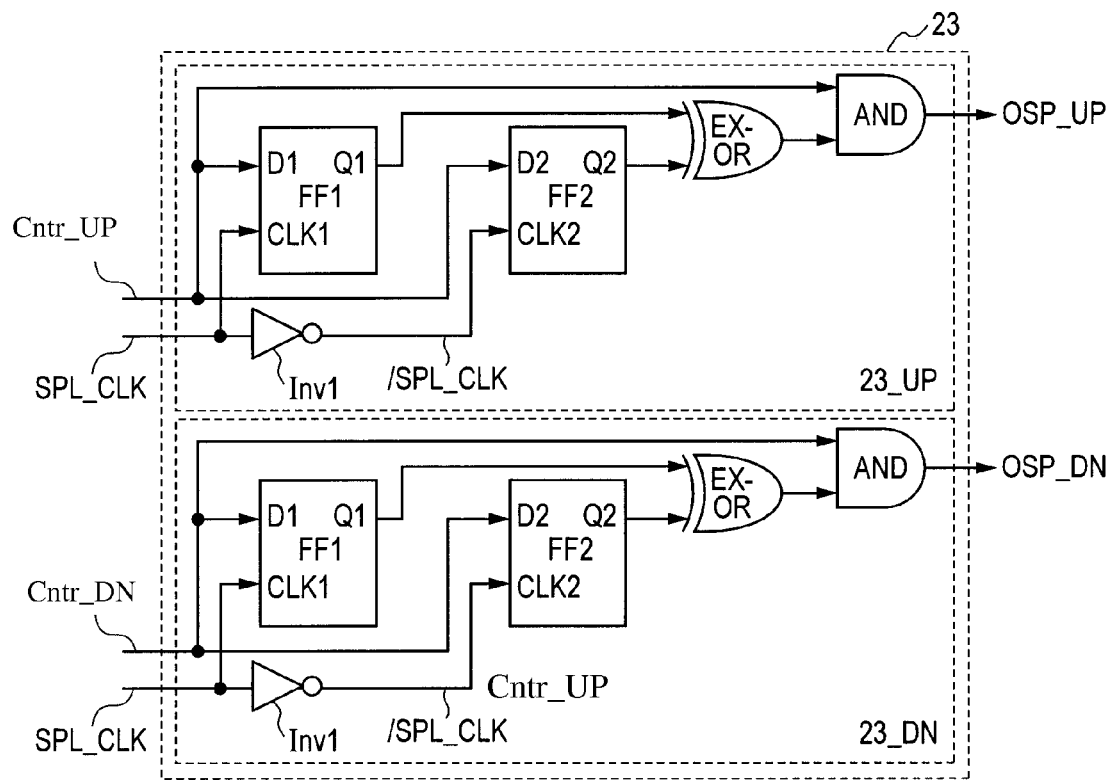
FIG. 7 is a diagram showing a configuration of a one-shot pulse generator (OSP) 23 of the loop attenuator (LA) 2 in the PLL circuit shown in FIG. 1.
Figure 8:
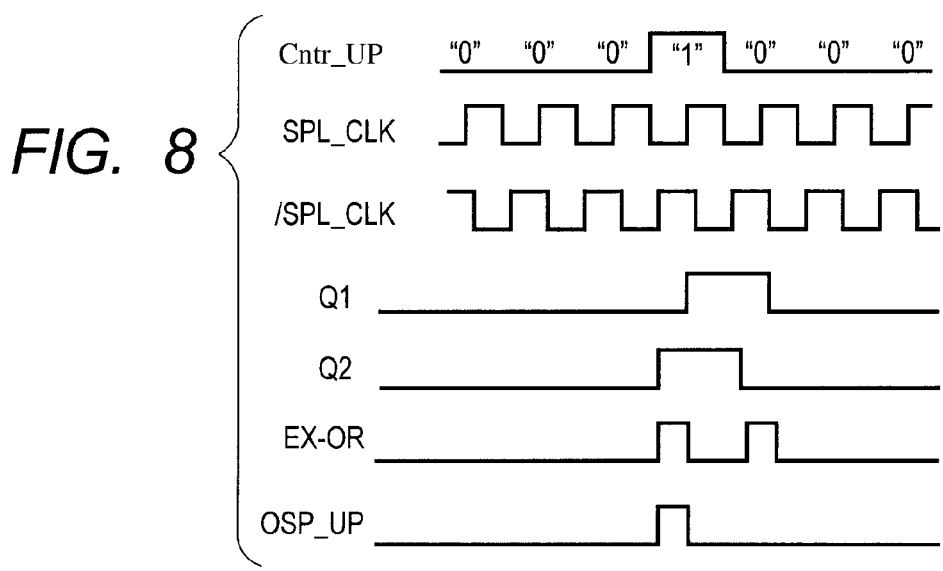
FIG. 8 is a diagram for describing the one-shot pulse generator (OSP) 23 shown in FIG. 7'.

The countup completion output signal and an output signal of the exclusive-OR circuit are respectively supplied to first and second input terminals of the AND circuit, whereby the one-shot pulse output signal is outputted from an output terminal of the AND circuit (refer to FIGS. 7 and 8). In effect, then, the one-shot pulse output signal (OSP_UP) is produced in response to the loop attenuator (2) receiving a phase-compared signal (11, 12) of constant value and sufficient duration reflecting a sufficiently continuous phase lead or phase lag of the feedback signal (9) relative to the reference signal (8).

In yet another preferred embodiment, the phase frequency comparator, the sampling circuit, the counter, the one-shot pulse generator, the charge pump, the loop filter and the divider are controlled to a low power consumption state in response to a standby control signal (10) of a predetermined level in a standby state (refer to FIG. 1).

A semiconductor integrated circuit according to a more preferred embodiment is further equipped with a controller (7) which outputs a counter control signal (17) supplied to the counter during a predetermined lapse period after the completion of the standby state, in response to the standby control signal having a level different from the predetermined level after the completion of the standby state.

When the counter completes a countup of the sampling pulses smaller in number than the predetermined number of sampling pulses in response to the counter control signal outputted from the controller during the predetermined lapse period after the completion of the standby state, the counter outputs the countup completion output signal (refer to FIG. 1).

In another more preferred embodiment, the phase locked loop circuit further includes a modulator (18) coupled to the divider (6).

Figure 10:
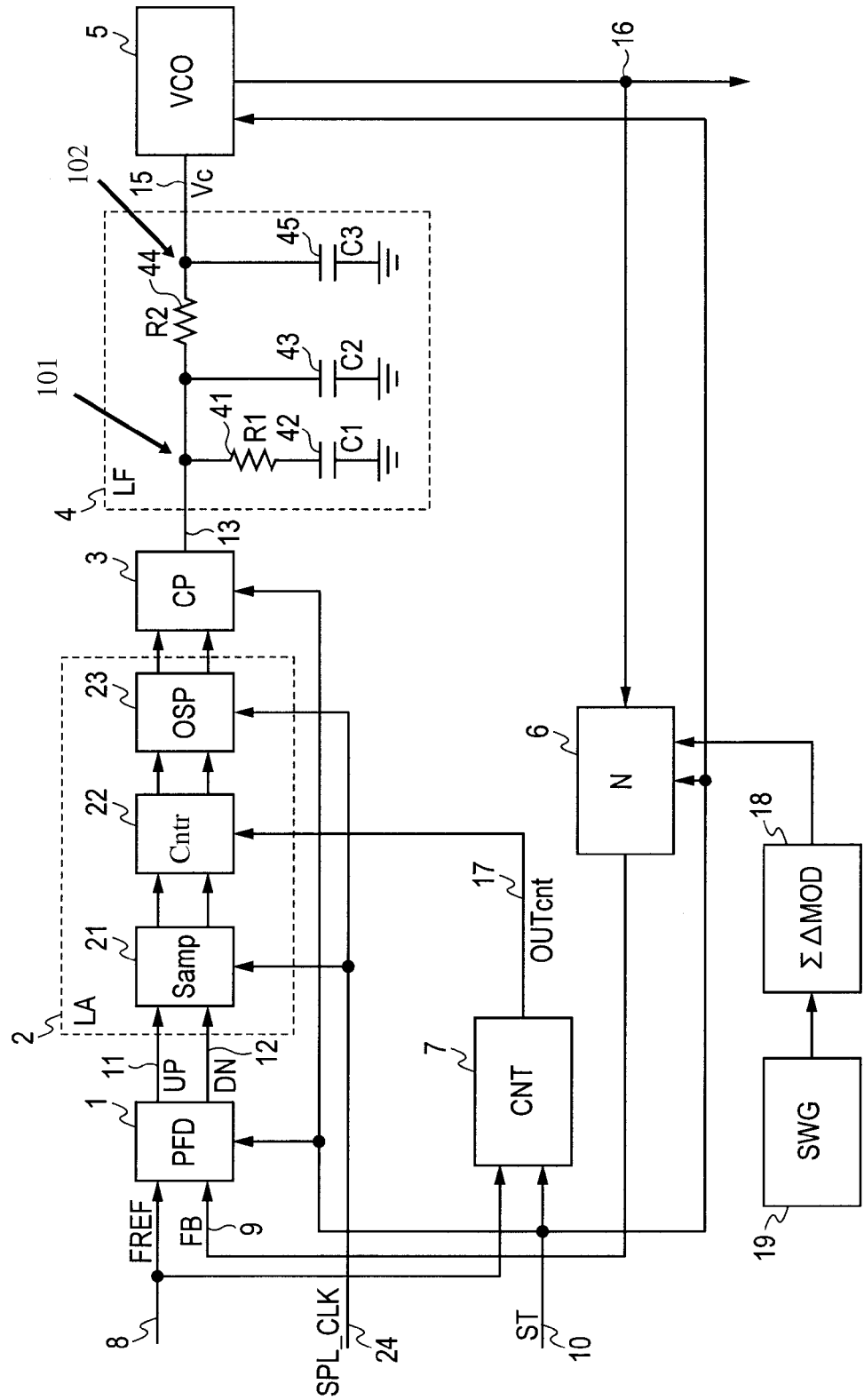
FIG. 10 shows a PLL circuit according to a second embodiment of the present invention, which is configured as a fractional PLL circuit that configures a spread spectrum clock generator (SSCG) used in a serial ATA interface unit.

The divider (6) changes between division numbers different in value in response to the output of the modulator (18), whereby the phase locked loop circuit is operated in an operation mode of a fractional PLL in which the average division number of the divider (6) is the sum of an integral part and a fractional part (refer to FIG. 10).

Figure 13:
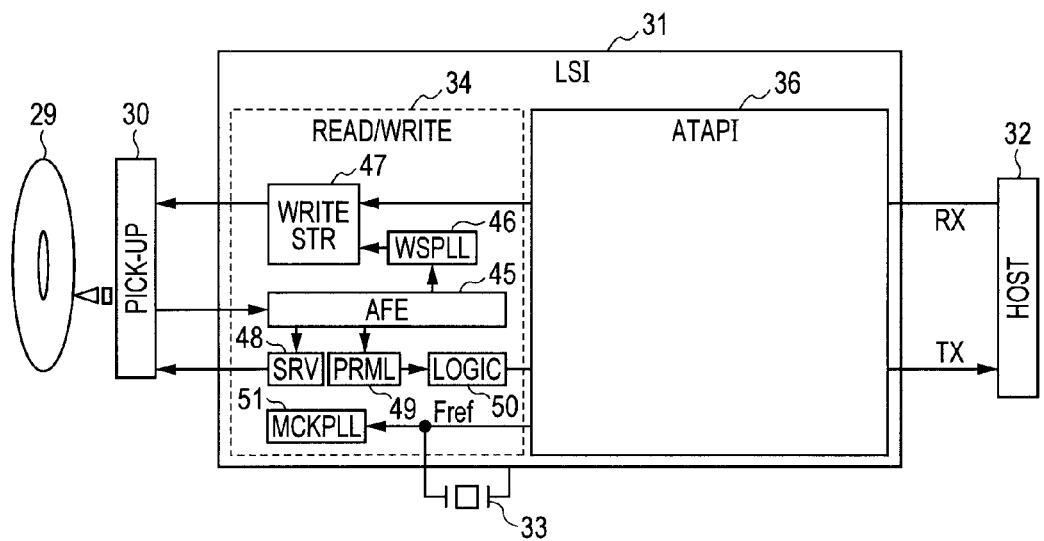
FIG. 13 is a diagram depicting a configuration of a recording and reproducing unit 34 according to a further embodiment of the present invention, which is coupled to a host computer as a peripheral device.
Figure 14:
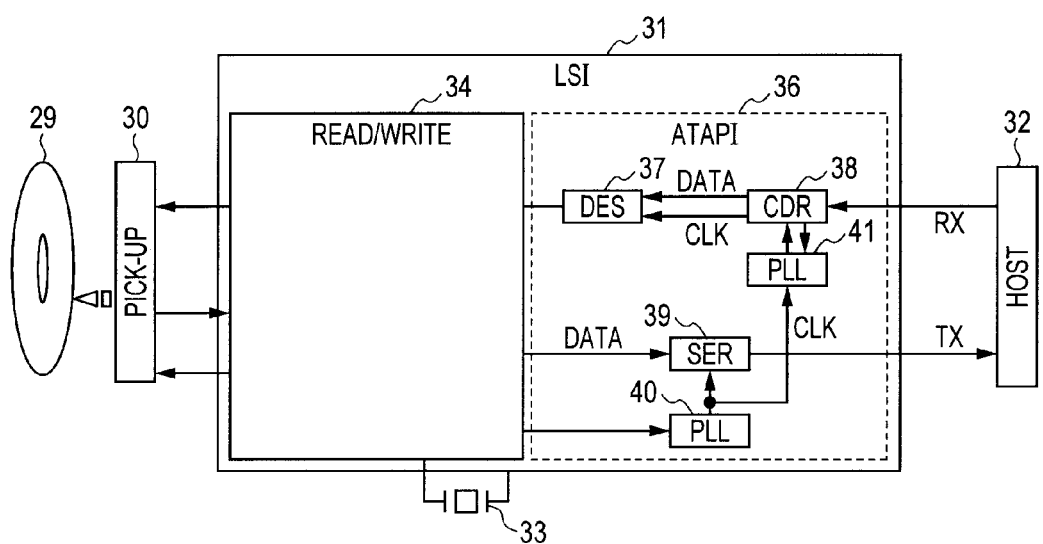
FIG. 14 is a diagram showing a configuration of an interface unit 36 according to a still further embodiment, which is coupled to a host computer as a peripheral device.

In a still further preferred embodiment, the phase locked loop circuit operated in the operation mode of the fractional PLL configures a spread spectrum clock generator (SSCG) used in an on-chipped serial ATA interface unit (refer to FIGS. 13 and 14).

In a concrete embodiment, the semiconductor integrated circuit including the serial ATA interface unit is coupleable between a storage disk device (29, 30) and a host device (32).

The semiconductor integrated circuit reads a read signal from the storage disk device and supplies read data to the host device. On the other hand, the semiconductor integrated circuit receives write data from the host device and supplies a write signal to the storage disk device (refer to FIGS. 13 and 14).

A typical embodiment of another aspect of the present invention is an operating method of a semiconductor integrated circuit that builds therein a phase locked loop circuit equipped with a phase frequency comparator (1), a loop attenuator (2), a charge pump (3), a loop filter (4), a voltage controlled oscillator (5) and a divider (6).

The phase frequency comparator compares a difference in phase between a reference signal (8) and a feedback signal (9) that is an output signal of the divider and outputs a first output signal (11) and a second output signal (12) each used as a phase-compared output signal.

The loop attenuator outputs a charge pump drive output signal supplied to the charge pump in response to the first output signal and the second output signal each used as the phase-compared output signal outputted from the phase frequency comparator.

The charge pump (3) outputs a charging current or a discharging current to the loop filter in response to the charge pump drive output signal outputted from the loop attenuator.

The loop filter (4) outputs a control voltage (Vc) supplied to the voltage controlled oscillator in response to the charging current or the discharging current outputted from the charge pump.

The voltage controlled oscillator (5) outputs an oscillation output signal (16) supplied to the divider in response to the control voltage outputted from the loop filter (4).

The divider (6) divides the oscillation output signal outputted from the voltage controlled oscillator (5) to thereby output the feedback signal (9) supplied to the phase frequency comparator (1).

When the phase of the feedback signal (9) lags the phase of the reference signal (8), a difference in pulse width between a first pulse (UP) having a long pulse width, of the first output signal (11) and a second pulse (DN) having a short pulse width, of the second output signal (12) corresponds to the lag in the phase between the reference signal (8) and the feedback signal (9).

The loop attenuator (2) includes at least a sampling circuit (21) and a counter (22).

The sampling circuit is supplied with a sampling pulse (SPL_CLK) and the first output signal and the second output signal outputted from the phase frequency comparator to thereby output a sampling output signal.

When the phase of the feedback signal (9) lags the phase of the reference signal (8), the sampling circuit outputs, as the sampling output signal, the sampling pulses supplied during a period of the pulse width of the first pulse of the first output signal outputted from the phase frequency comparator.

When the counter (22) completes a countup of a predetermined number of the sampling pulses outputted as the sampling output signal from the sampling circuit, the counter outputs a countup completion output signal.

The charge pump (3) outputs the charging current or the discharging current to the loop filter in response to the countup completion output signal outputted from the counter of the loop attenuator (refer to FIGS. 1 and 2).

According to the embodiment, when the loop filter of the PLL circuit is on-chipped, it is possible to reduce variations in the characteristics of the PLL circuit due to variations in the device size of each transistor and reduce increases in both circuit scale and power consumption of the semiconductor integrated circuit.

2. Further Detailed Description of the Embodiments

Embodiments will next be explained in further detail. Incidentally, in all of the drawings for explaining the best modes for carrying out the invention, the same reference numerals are respectively attached to components having the same function as in the drawings, and their repetitive description will be omitted.

First Embodiment

Configuration of PLL Circuit

FIG. 1 is a diagram for describing a configuration of a PLL circuit onchip-integrated into a semiconductor integrated circuit according to a first embodiment of the present invention.

The onchip-integrated PLL circuit according to the first embodiment of the present invention shown in FIG. 1 is comprised of a phase frequency comparator (PFD) 1, a loop attenuator (LA) 2, a charge pump (CP) 3, a loop filter (LF) 4, a voltage controlled oscillator (VCO) 5, a divider (N) 6 and a controller (CNT) 7. The loop attenuator (LA) 2 includes a sampling circuit (Samp) 21, a counter (Cntr) 22 and a one-shot pulse generator (OSP) 23.

The phase frequency comparator (PFD) 1 outputs a first output signal (UP) 11 and a second output signal (DN) 12 as phase-compared output signals with a reference signal (FREF) 8 and a feedback signal (FB) 9 as input signals. When the phase of the feedback signal (FB) 9 lags the phase of the reference signal (FREF) 8, a difference between a high level period of the first output signal (UP) and a high level period of the second output signal (DN) 12 corresponds to the delay in the phase of the feedback signal (FB) 9 with respect to the phase of the reference signal (FREF) 8 to increase an oscillation frequency of the voltage controlled oscillator (VCO) 5. Since the high level period of the first output signal (UP) 11 is longer than the high level period of the second output signal (DN) 12, the oscillation frequency of the voltage controlled oscillator (VCO) 5 increases and thereby the delay in the phase of the feedback signal (FB) 9 with respect to the phase of the reference signal (FREF) 8 decreases, thus resulting in the occurrence of a PLL locked state in which the phase of the reference signal (FREF) 8 and the phase of the feedback signal (FB) 9 coincide with each other. In this PLL locked state, the first output signal (UP) 11 and the second output signal (DN) 12 are brought to high level periods having the same narrow width.

Loop Attenuator

In the semiconductor integrated circuit according to the first embodiment of the present invention shown in FIG. 1, the loop attenuator (LA) 2 including the sampling circuit (Samp) 21, the counter (Cntr) 22 and the one-shot pulse generator (OSP) 23 is disposed between the output of the phase frequency comparator (PFD) 1 and the input of the charge pump (CP) 3 to achieve on-chipping of the loop filter (LF) 4 of the PLL circuit.

The sampling circuit (Samp) 21 outputs pulse signals of the sampling pulse SPL_CLK included in one high-level period, of the first and second output signals (UP) 11 and (DN) 12 of the phase frequency comparator (PFD) 1 in response to the sampling pulse SPL_CLK. Thus, when the phase of the feedback signal (FB) 9 lags the phase of the reference signal (FREF) 8, the sampling circuit (Samp) 21 outputs the pulse signals of the sampling pulse SPL_CLK during the high level period of the first output signal (UP) 11. Accordingly, the sampling circuit (Samp) 21 converts an amount of a delay in the phase of the feedback signal (FB) 9 with respect to the phase of the reference signal (FREF) 8 to the output number of pulse signals of the sampling pulse SPL_CLK.

On the other hand, the phase of the feedback signal (FB) 9 leads the phase of the reference signal (FREF) 8, the sampling circuit (Samp) 21 outputs the pulse signals of the sampling pulse SPL_CLK during the high level period of the second output signal (DN) 12. Thus, the sampling circuit (Samp) 21 converts an amount of a lead in the phase of the feedback signal (FB) 9 with respect to the phase of the reference signal (FREF) 8 into the output number of pulse signals of the sampling pulse SPL_CLK.

The counter (Cntr) 22 counts up the pulse signals of the sampling pulse SPL_CLK outputted from the sampling circuit (Samp) 21. When the countup of a predetermined number of pulse signals of the sampling pulse SPL_CLK is completed by the countup of the counter (Cntr) 22, the counter (Cntr) 22 generates a countup completion output signal. When the counter (Cntr) 22 completes the countup of the predetermined number of pulse signals of the sampling pulse SPL_CLK and generates the countup completion output signal, the counter (Cntr) 22 is reset by a reset signal RESET of a high level. Accordingly, the reset counter (Cntr) 22 starts again the countup of the pulse signals of the sampling pulse SPL_CLK outputted from the sampling circuit (Samp) 21.

The one-shot pulse generator (OSP) 23 generates a one-shot pulse output signal having a pulse width approximately equal to the pulse width of the sampling pulse SPL_CLK in response to the countup completion output signal generated from the counter (Cntr) 22.

Thus, upon counting a predetermined number of samples, the counter (Cntr) 22 outputs the countup completion output signal to trigger the one-shot pulse generator (OSP) 23 to create the one-shot pulse output signal. In effect, then, the one-shot pulse generator (OSP) 23 outputs a signal (OSP_UP) in response to the loop attenuator 2 receiving a phase-compared signal 11, 12 of constant value and sufficient duration reflecting a sufficiently continuous phase lead or phase lag of the feedback signal 9 relative to the reference signal 8.

Charge Pump

The charge pump (CP) 3 supplies a charging/discharging current to the loop filter (LF) 4 in response to the one-shot pulse output signal generated from the one-shot pulse generator (OSP) 23. For example, when the phase of the feedback signal (FB) 9 lags the phase of the reference signal (FREF) 8, the charge pump (CP) 3 supplies the charging current to the loop filter (LF) 4. Therefore, the control voltage Vc of the loop filter (LF) 4 increases, the oscillation frequency of the voltage controlled oscillator (VCO) 5 increases, and the delay in the phase of the feedback signal (FB) 9 with respect to the phase of the reference signal (FREF) 8 decreases, thus resulting in the occurrence of a PLL locked state in which the phase of the reference signal (FREF) 8 and the phase of the feedback signal (FB) 9 coincide with each other. When the phase of the feedback signal (FB) 9 leads the phase of the reference signal (FREF) 8, the charge pump (CP) 3 supplies the discharging current to the loop filter (LF) 4. Therefore, the control voltage Vc of the loop filter (LF) 4 decreases, the oscillation frequency of the voltage controlled oscillator (VCO) 5 decreases, and the amount of a lead in the phase of the feedback signal (FB) 9 with respect to the phase of the reference signal (FREF) 8 is reduced, thus again resulting in the occurrence of a PLL locked state in which the phase of the reference signal (FREF) 8 and the phase of the feedback signal (FB) 9 coincide with each other.

Loop Filter

In the semiconductor integrated circuit according to the first embodiment of the present invention shown in FIG. 1, a three-dimensional lag/lead filter is used as the loop filter (LF) 4.

In the loop filter (LF) 4, a first resistor (R1) 41 and a first capacitor (C1) 42 are coupled in series with one end of the first resistor (R1) 41 coupled to an input node 101 and one end of the first capacitor (C1) 42 coupled to a ground potential. A second capacitor (C2) 43 is connected at one end to the input node 101 and is coupled in parallel with the series-coupled first resistor (R1) 41 and first capacitor (C1) 42. The other end of the second capacitor (C2) 43 is coupled to the ground potential.

One end of a second resistor (R2) 44 is coupled to a first node 101 to which the first resistor (R1) 41 and the second capacitor (C2) 43 are coupled. The other end of the second resistor (R2) 44 is coupled to a second node 102 to which one end of third capacitor (C3) 45 is coupled, the other end of the third capacitor (C3) 45 being coupled to the ground potential.

A control voltage V supplied to the voltage controlled oscillator (VCO) 5 is generated at an output node 15 (Vc) to which the second resistor (R2) 44 and the third capacitor (C3) 45 are coupled.

A charge/discharge output signal 13 of the charge pump (CP) 3 is supplied to the input node 101 to which the first resistor (R1) 41, the second capacitor (C2) 43 and the second resistor (R2) 44 are coupled.

The first capacitor (C1) 42 of the loop filter (LF) 4 converts the charging/discharging current 13 from the charge pump (CP) 3 into a charging/discharging voltage Vc. The first resistor (R1) 41 is inserted to improve a phase allowance (or "phase margin") assuming that a phase shift at a crossover frequency is 180° or less. The second capacitor (C2) reduces ripple components due to a mismatch between the charging current and the discharging current of the charge pump (CP) 3 and cross-field through from a charge/discharge switch of the charge pump (CP) 3. A low-pass filter comprised of the second resistor (R2) 44 and the third capacitor (C3) 45 further reduces ripple components of the control voltage VC generated at the output node 15 of the loop filter (LF) 4.

Output Feedback of Voltage Controlled Oscillator by Divider

The voltage controlled oscillator (VCO) 5 supplied with the control voltage Vc generated at the output node 15 of the loop filter (LF) 4 generates an output signal 16 having a frequency controlled by the control voltage Vc. The output signal 16 becomes an output signal for the PLL circuit and at the same time is supplied to the divider (N) 6. In accordance with a division ratio N set in advance, the divider (N) 6 performs the operation of dividing the output signal 16 of the voltage controlled oscillator (VCO) 5. A divided output signal from the divider (N) is inputted to the other input terminal of the phase frequency comparator (PFD) 1 as the feedback signal (FB) 9 and compared with the phase of the reference signal (FREF) 8 inputted to one input terminal of the phase frequency comparator (PFD) 1.

When the phase of the feedback signal (FB) 9 from the output of the divider (N) 6 lags the phase of the reference signal (FREF) 8, the phase frequency comparator (PFD) 1 generates a first output signal (UP) 11 used as an up signal for advancing the phase of the feedback signal (FB) 9. Since the charge pump (CP) 3 performs the charging operation of the loop filter (LF) 4 in response to the first output signal (UP) 11, the control voltage Vc of the loop filter (LF) 4 rises. As a result, the oscillation frequency of the voltage controlled oscillator (VCO) 5 increases in response to the rise in the control voltage Vc, so that the phase of the feedback signal (FB) 9 from the output of the divider (N) 6 is advanced so as to coincide with the phase of the reference signal (FREF) 8.

In contrast, when the phase of the feedback signal (FB) 9 from the output of the divider (N) 6 leads the phase of the reference signal (FREF) 8, the phase frequency comparator (PFD) 1 generates a second output signal (DN) 12 used as a down signal for delaying the phase of the feedback signal (FB) 9. Since the charge pump (CP) 3 performs the discharging operation of the loop filter (LF) 4 in response to the second output signal (DN) 12, the control voltage Vc of the loop filter (LF) 4 is reduced. As a result, the oscillation frequency of the voltage controlled oscillator (VCO) 5 decreases in response to the reduction in the control voltage Vc, so that the phase of the feedback signal (FB) 9 from the output of the divider (N) 6 is delayed so as to coincide with the phase of the reference signal (FREF) 8.

Steady Lock Operation

FIG. 2 is a diagram showing waveforms of the respective parts of the PLL circuit during a period in which the PLL circuit according to the first embodiment of the present invention shown in FIG. 1 performs a steady lock operation.

At the upper part of FIG. 2, the waveform of the sampling pulse SPL_CLK is shown, and the first output signal UP as the up signal and the second output signal DN as the down signal both generated from the phase frequency comparator (PFD) 1 where the phase of the feedback signal (FB) 9 lags the phase of the reference signal (FREF) 8 are shown. In this case, a high level period of the first output signal UP becomes longer than that of the second output signal DN 12.

A first sampling output signal Samp_UP as an up signal and a second sampling output signal Samp_DN as a down signal both generated from the sampling circuit (Samp) 21 are shown in FIG. 2. In this case, during the long high level period 140 of the first output signal UP, pulse signals of the sampling pulse SPL_CLK are generated from the sampling circuit (Samp) 21 as the first sampling output signal Samp_UP. On the other hand, in this case, the second sampling output signal Samp_DN is maintained at a low level "0" without pulse signals of the sampling pulse SPL_CLK being generated as the second sampling output signal Samp_DN from the sampling circuit (Samp) 21 during the short high level period 150 of the second output signal DN.

A first countup completion output signal Cntr_UP as an up signal and a second countup completion output signal Cntr_DN as a down signal both generated from the counter (Cntr) 22 are shown in FIG. 2. In this case, there is shown in FIG. 2, an example in which the predetermined number of pulse signals of the sampling pulse SPL_CLK for completing the countup by the counter (Cntr) 22 is set to four. Thus, one first countup completion output signal Cntr_UP is generated from the counter (Cntr) 22 in response to the four pulse signals of the sampling pulse SPL_CLK generated as the first sampling output signal Samp_UP from the sampling circuit (Samp) 21. On the other hand, since the second sampling output signal Samp_DN generated from the sampling circuit (Samp) 21 is maintained at the low level "0" in this case, the second countup completion output signal Cntr_DN generated from the counter (Cntr) 22 is maintained at the low level "0".

A first one-shot pulse output signal OSP_UP as an up signal, and a second one-shot pulse output signal OSP_DN as a down signal both generated from the one-shot pulse generator (OSP) 23 are shown in FIG. 2. In this case, a first one-shot pulse output signal OSP_UP having a pulse width approximately equal to that of the sampling pulse SPL_CLK is generated from the one-shot pulse generator (OSP) 23 in response to the first countup completion output signal Cntr_UP generated from the counter (Cntr) 22. On the other hand, since the second countup completion output signal Cntr_DN generated from the counter (Cntr) 22 is maintained at the low level "0" in this case, the second one-shot pulse output signal OSP_DN generated from the one-shot pulse generator (OSP) 23 is maintained at the low level "0".

Thus, in the PLL circuit according to the first embodiment of the present invention shown in FIG. 1, the charge pump (CP) 3 supplies a charging current 13 set to a predetermined current value during a high level "1" of the first one-shot pulse output signal OSP_UP as the up signal generated from the one-shot pulse generator (OSP) 23 to the input node 101 of the loop filter (LF) 4. On the other hand, since the second one-shot pulse output signal OSP_DN as the down signal generated from the one-shot pulse generator (OSP) 23 is maintained at the low level "0", the charge pump (CP) 3 does not supply a discharging current set to a predetermined current value to the input node 101 of the loop filter (LF) 4. As a result, since the control voltage Vc of the loop filter (LF) 4 rises, the oscillation frequency of the voltage controlled oscillator (VCO) 5 increases and thereby the phase of the feedback signal (FB) 9 from the output of the divider (N) 6 is advanced so as to coincide with the phase of the reference signal (FREF) 8.

Thus, during the period in which the PLL circuit according to the first embodiment of the present invention shown in FIG. 1 performs the steady lock operation, a period during which the charge pump (CP) 3 supplies the charging current or the discharging current set to the predetermined current value to the input node 13 of the loop filter (LF) 4 is reduced lower than the high level period of the first output signal (UP) 11 or the second output signal (DN) 12 of the phase frequency comparator (PFD) 1. The rate of the reduction in the period can arbitrarily be set by the predetermined number of pulse signals of the sampling pulse SPL_CLK for completing the countup by the counter (Cntr) 22. With this period reduction rate, the effective time constant of the loop filter (LF) 4 becomes larger than the time constant determined by the resistance value of each actual resistive element included in the loop filter (LF) 4 and the capacitance value of each actual capacitive element included therein.

Thus, according to the PLL circuit according to the first embodiment of the present invention shown in FIG. 1, the loop filter (LF) 4 can be on-chipped. The rate of increase in the effective time constant of the loop filter (LF) 4 can arbitrarily be set by the above period reduction rate. Also the period reduction rate is determined by the operations of the sampling circuit (Samp) 21, counter (Cntr) 22 and one-shot pulse generator (OSP) 23 that perform the digital operation within the loop attenuator (LA) 2. As a result, according to the PLL circuit according to the first embodiment of the present invention shown in FIG. 1, it is possible to reduce variations in the characteristics of the PLL circuit due to variations in the device size of each transistor and reduce increases in both circuit scale and power consumption of the semiconductor integrated circuit.

Standby State of Low Power Consumption at which the Lock Operation is Stopped

In the standby state in which a write operation (recording operation) and a read operation (reproducing operation) of an optical disc such as a CD, a BD or the like are not performed, the PLL circuit need not to execute the lock operation, and for low power consumption, the PLL circuit is brought to a state in which the lock state is stopped.

In order to bring the PLL circuit to the lock operation stop state, a standby control signal (ST) 10 of a high level is supplied to the phase frequency comparator (PFD) 1, the sampling circuit (Samp) 21, counter (Cntr) 22 and one-shot pulse generator (OSP) 23 of the loop attenuator (LA) 2, the charge pump (CP) 3, the voltage controlled oscillator (VCO) 5, the divider (N) 6 and the controller (CNT) 7. Consequently, since the PLL circuit of FIG. 1 stops the lock operation as a whole, the entire power consumption of the PLL circuit of FIG. 1 is reduced and hence, the life of a battery can be prolonged.

According to a preferred embodiment of the present invention, the phase frequency comparator (PFD) 1, the loop attenuator (LA) 2, the charge pump (CP) 3 and the divider (N) 6 are controlled to a cutoff state in response to the standby control signal (ST) 10 of the high level in the standby state, so that power consumption is reduced. On the other hand, the voltage controlled oscillator (VCO) 5 is controlled to an operating current of a level lower than usual. Thus, the voltage controlled oscillator (VCO) 5 maintains self-running oscillations of a low power consumption state in the standby state. As a result, it is possible to improve the responsivity of the PLL circuit of FIG. 1 where the transition of status from the standby state to a high-speed lock response operation is carried out.

High-Speed Lock Response Operation

In order to make a transition from the standby state in which the write operation (recording operation) and the read operation (reproducing operation) of the optical disc such as a CD, a BD or the like are not performed, to the write operation (recording operation) or the read operation (reproducing operation) of the optical disc such as the CD, the BD or the like, the PLL circuit according to the first embodiment of the present invention shown in FIG. 1 needs a high-speed lock response operation for starting the lock operation from the standby state at high speed.

Thus, in the PLL circuit according to the first embodiment of the present invention shown in FIG. 1, the standby control signal (ST) 10 is changed from a high level to a low level during the high-speed lock response operation, so that the phase frequency comparator 1, the loop attenuator (LA) 2, the charge pump (CP) 3, the voltage controlled oscillator 5, the divider 6 and the controller 7 are respectively brought to a state of executing its circuit operation. In the PLL circuit according to the first embodiment of the present invention shown in FIG. 1 in particular, the controller 7 supplies a counter control signal 17 to the counter (Cntr) 22 during the high-speed lock response operation and a predetermined period immediately after power-on. Thus, the counter (Cntr) 22 counts pulse signals of the sampling pulse SPL_CLK corresponding to the number smaller than the predetermined number in the case of the above steady lock operation and thereby completes the countup operation. As a result, the first one-shot pulse output signal OSP_UP as the up signal generated from the one-shot pulse generator (OSP) 23 increases in number as compared with the case of the steady lock operation during the high-speed lock response operation and the predetermined period immediately after power-on. Thus, since the control voltage of the output node 15 (Vc) of the loop filter (LF) 4 rises suddenly, the voltage controlled oscillator (VCO) 5 is controlled at high speed so that high-speed lock of the PLL circuit can be performed.

Thereafter, the supply of the counter control signal 17 from the controller 7 to the counter (Cntr) 22 is completed. When the counter (Cntr) 22 counts the predetermined number of pulse signals of the sampling pulse SPL_CLK, the counter (Cntr) 22 completes its countup operation.

Configuration of Sampling Circuit

Figure 3:
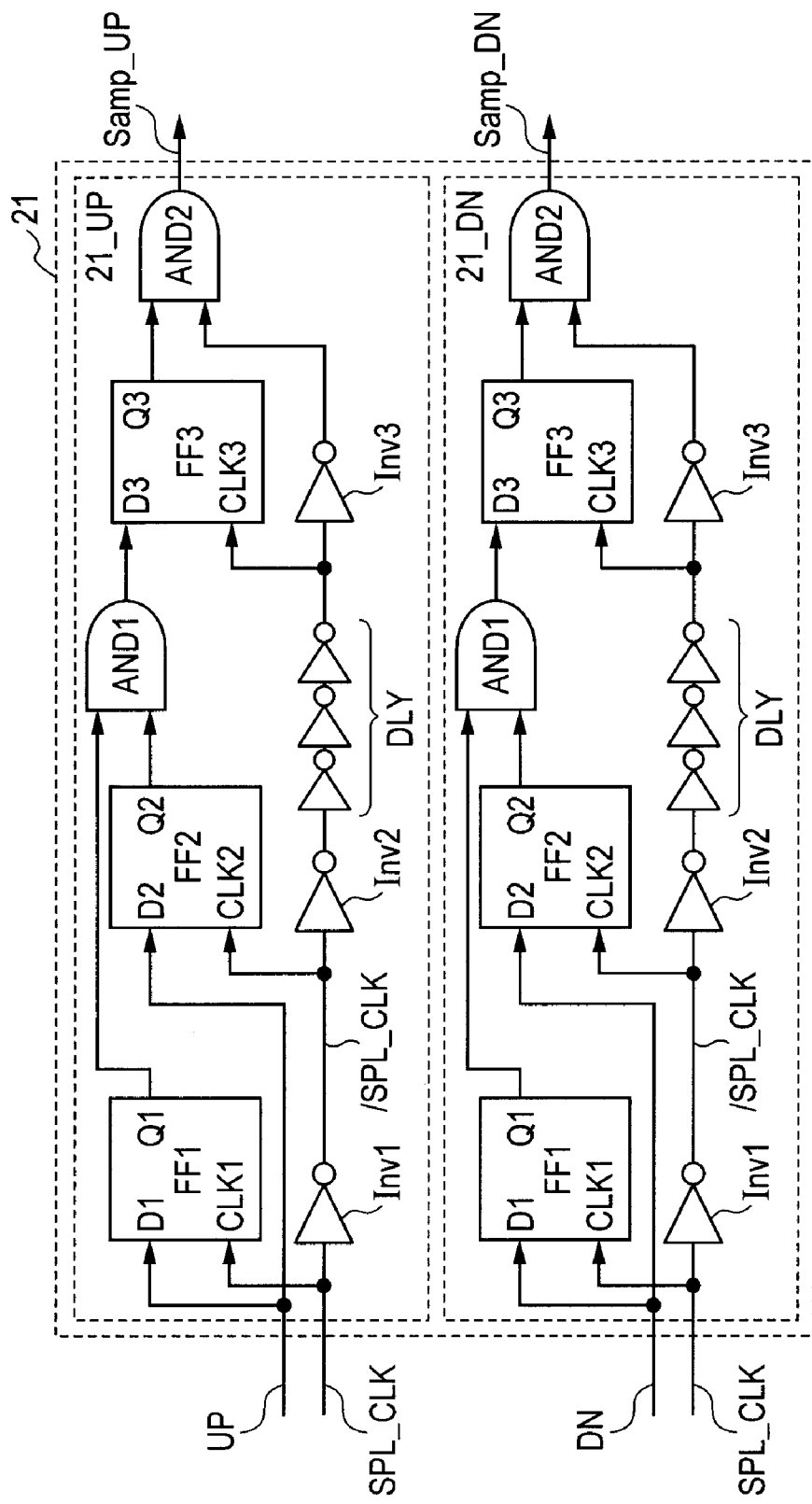
FIG. 3 is a diagram illustrating a configuration of a sampling circuit (Samp) 21 of a loop attenuator (LA) 2 in the PLL circuit shown in FIG. 1.

FIG. 3 shows a configuration of the sampling circuit (Samp) 21 of the loop attenuator (LA) 2 of the PLL circuit according to the first embodiment of the present invention shown in FIG. 1.

As shown in FIG. 3, the sampling circuit (Samp) 21 is comprised of a first sampling circuit 21_UP which is supplied with the first output signal UP generated from the phase frequency comparator (PFD) 1 to thereby generate a first sampling output signal Samp_UP supplied to the counter (Cntr) 22, and a second sampling circuit 21_DN which is supplied with the second output signal DN generated from the phase frequency comparator (PFD) 1 to thereby generate a second sampling output signal Samp_DN supplied to the counter (Cntr) 22.

Each of the first sampling circuit 21_UP and the second sampling circuit 21_DN is configured by a first flip-flop FF1, a second flip-flop FF2, a third flip-flop FF3, a first inverter Inv1, a second inverter Inv2, a third inverter Inv3, a first AND circuit AND1, a second AND circuit AND2, and a delay circuit DLY.

First, in the first sampling circuit 21_UP, the first output signal UP generated from the phase frequency comparator (PFD) 1 is supplied to a data input terminal D1 of the first flip-flop FF1 and a data input terminal D2 of the second flip-flop FF2. The sampling pulse SPL_CLK is supplied to a clock input terminal CLK1 of the first flip-flop FF1 and an input terminal of the inverter Inv1. The first sampling output signal Samp_UP supplied to the counter (Cntr) 22 is generated from an output terminal of the second AND circuit AND2.

Next, in the second sampling circuit 21_DN, the second output signal DN generated from the phase frequency comparator (PFD) 1 is supplied to a data input terminal D1 of the first flip-flop FF1 and a data input terminal D2 of the second flip-flop FF2. The sampling pulse SPL_CLK is supplied to a clock input terminal CLK1 of the first flip-flop FF1 and an input terminal of the inverter Inv1. The second sampling output signal Samp_DN supplied to the counter (Cntr) 22 is generated from an output terminal of the second AND circuit AND2.

In each of the first sampling circuit 21_UP and the second sampling circuit 21_DN, an inverted sampling pulse /SPL_CLK generated from an output terminal of the first inverter Inv1 is supplied to a clock input terminal CLK2 of the second flip-flop FF2 and an input terminal of the second inverter Inv2. Output data Q1 of the first flip-flop FF1 and output data Q2 of the second flip-flop FF2 are respectively supplied to a first input terminal and a second input terminal of the first AND circuit AND1. An output signal of the first AND circuit AND1 is supplied to a data input terminal D3 of the third flip-flop circuit FF3. An output signal of the second inverter Inv2 is supplied to a clock input terminal CLK3 of the third flip-flop FF3 and an input terminal of the third inverter Inv3 via the delay circuit DLY. Output data Q3 of the third flip-flop FF3 and an output signal of the third inverter Inv3 are respectively supplied to a first input terminal and a second input terminal of the second AND circuit AND2.

Operation of Sampling Circuit

Figure 4:
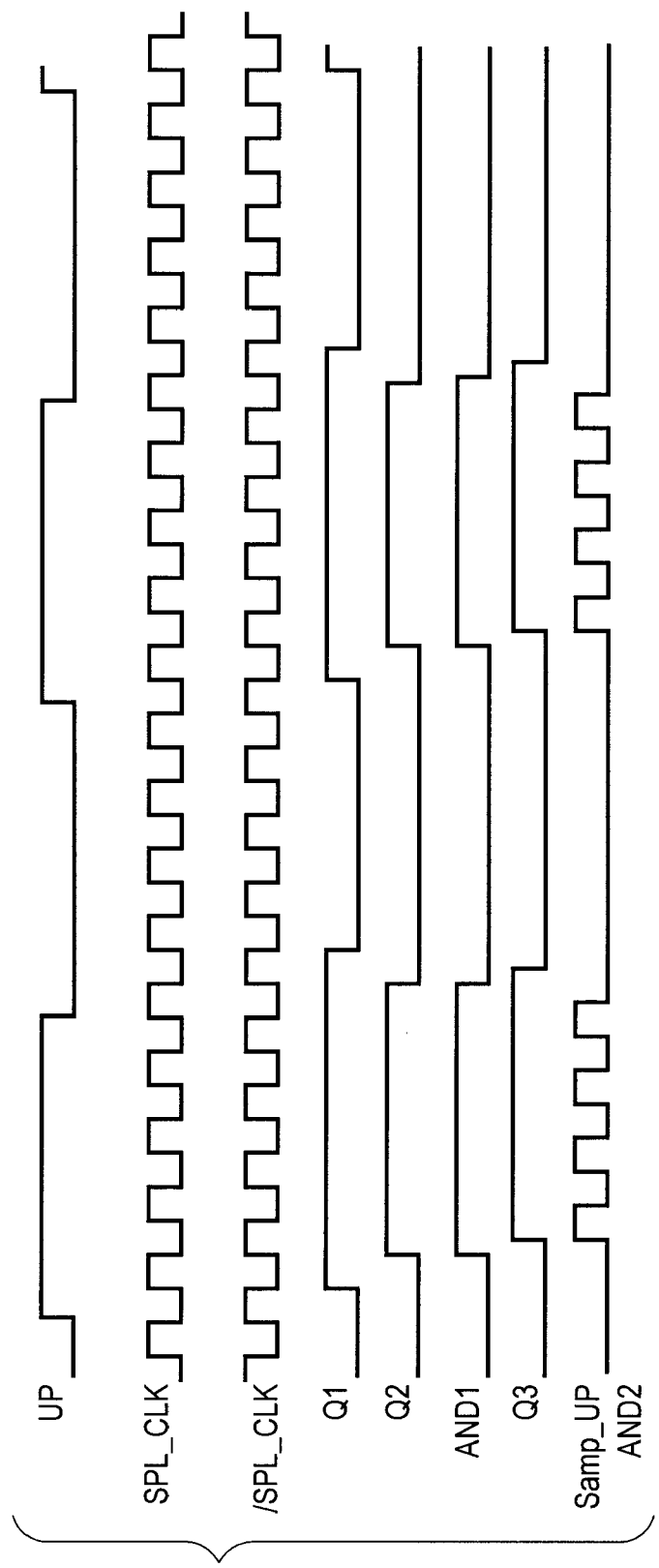
FIG. 4 is a diagram for describing the operation of the sampling circuit (Samp) 21 shown in FIG. 3.

FIG. 4 is a diagram for describing the operation of the sampling circuit (Samp) 21 according to the first embodiment of the present invention, which is shown in FIG. 3.

Incidentally, FIG. 4 shows the operation of the first sampling circuit 21_UP where a high level period of the first output signal UP is longer than a high level period of the second output signal DN with respect to the first output signal UP and the second output signal DN generated from the phase frequency comparator (PFD) 1.

First, the first flip-flop FF1 of the first sampling circuit 21_UP samples and holds an amplitude level of the first output signal UP of the phase frequency comparator (PFD) 1 at a timing of a rising edge of the sampling pulse SPL_CLK to thereby generate output data Q1 corresponding to the high level period of the first output signal UP of the phase frequency comparator (PFD) 1. Next, the second flip-flop FF2 of the first sampling circuit 21_UP samples and holds an amplitude level of the first output signal UP of the phase frequency comparator (PFD) 1 at a timing of a rising edge of the inverted sampling pulse /SPL_CLK to thereby generate output data Q2 corresponding to the high level period of the first output signal UP of the phase frequency comparator (PFD) 1.

The output data Q1 of the first flip-flop FF1 of the first sampling circuit 21_UP and the output data Q2 of the second flip-flop FF2 are AND-processed by the first AND circuit AND1 to generate an output signal of the first AND circuit AND1, followed by being supplied to the data input terminal D3 of the third flip-flop FF3. The third flip-flop FF3 of the first sampling circuit 21_UP samples and holds an amplitude level of the output signal of the first AND circuit AND1 at a timing of a rising edge of the delayed inverted sampling pulse /SPL_CLK supplied via the second inverter Inv2 and the delay circuit DLY to thereby generate output data Q3.

During the high level period of the output data Q3 of the third flip-flop FF3, the second AND circuit AND2 outputs the sampling pulse SPL_CLK supplied via the first inverter Inv1, the second inverter Inv2, the delay circuit DLY and the third inverter Inv3 as the first sampling output signal Samp_UP.

Thus, the sampling circuit (Samp) 21 outputs the pulse signals of the sampling pulse SPL_CLK included in the period of one long in high level, of the first and second output signals (UP) 11 and (DN) 12 of the phase frequency comparator (PFD) 1 in response to the sampling pulse SPL_CLK. Thus, when the phase of the feedback signal (FB) 9 lags the phase of the reference signal (FREF) 8, the sampling circuit (Samp) 21 outputs the pulse signals of the sampling pulse SPL_CLK during the long high level period of the first output signal (UP) 11.

Configuration of Counter

Figure 5:
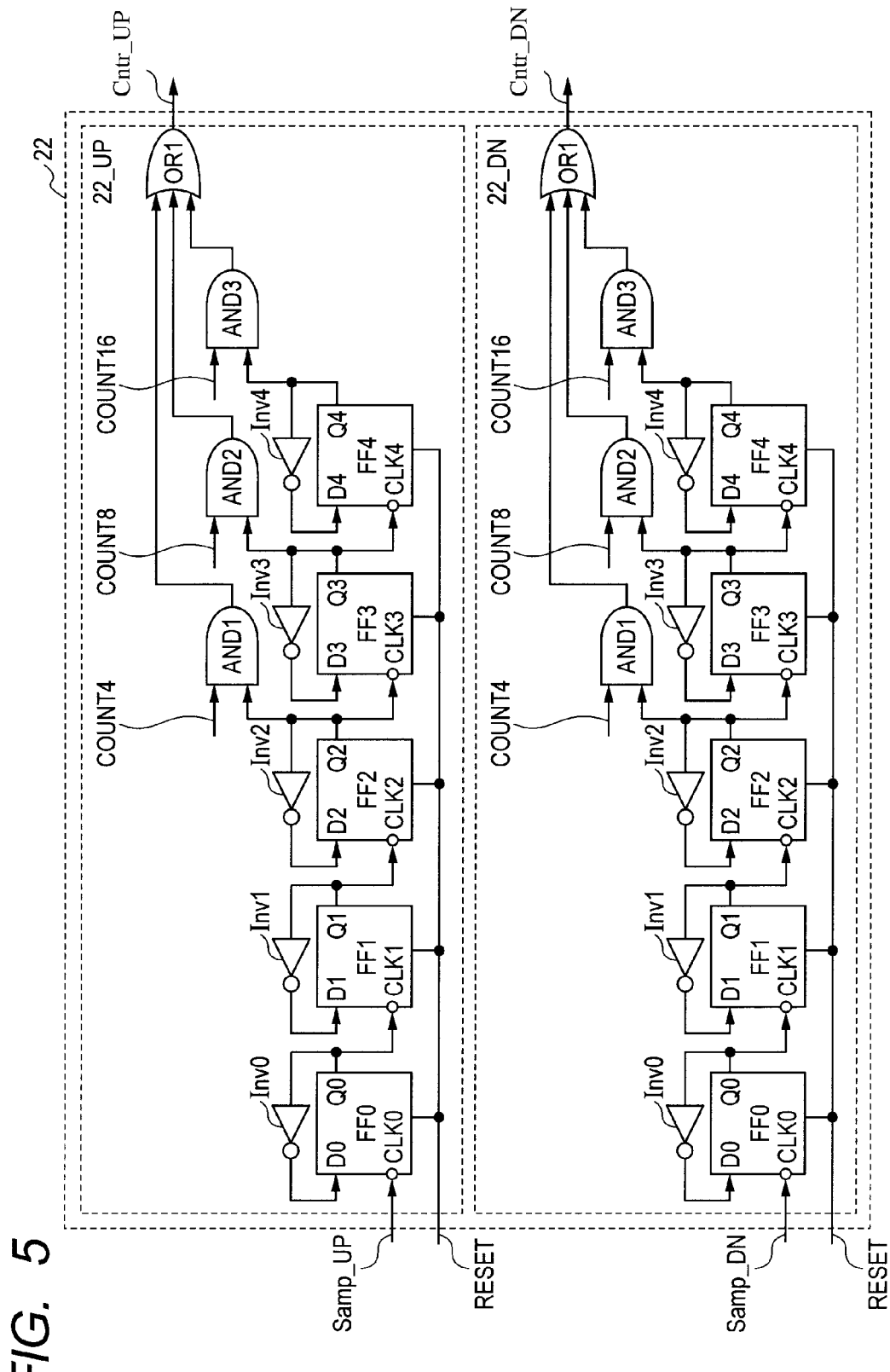
FIG. 5 is a diagram depicting a configuration of a counter (Cntr) 22 of the loop attenuator (LA) 2 in the PLL circuit shown in FIG. 1.

FIG. 5 is a diagram showing a configuration of the counter (Cntr) 22 of the loop attenuator (LA) 2 of the PLL circuit according to the first embodiment of the present invention shown in FIG. 1.

As shown in FIG. 5, the counter (Cntr) 22 is comprised of a first counter circuit 22_UP which is supplied with the first sampling output signal Samp_UP generated from the sampling circuit (Samp) 21 to thereby generate a first countup completion output signal Cntr_UP supplied to the one-shot pulse generator (OSP) 23, and a second counter circuit 22_DN which is supplied with the second sampling output signal Samp_DN generated from the sampling circuit (Samp) 21 to thereby generate a second countup completion output signal Cntr_DN supplied to the one-shot pulse generator (OSP) 23.

Each of the first and second counter circuits 22_UP and 22_DN is comprised of a first flip-flop FF0, a second flip-flop FF1, a third flip-flop FF2, a fourth flip-flop FF3, a fifth flip-flop FF4, a first inverter Inv0, a second inverter Inv1, a third inverter Inv2, a fourth inverter Inv3, a fifth inverter Inv4, a first AND circuit AND1, a second AND circuit AND2, a third AND circuit AND3 and a first OR circuit OR1.

First, in the first counter circuit 22_UP, the first sampling output signal Samp_UP generated from the sampling circuit (Samp) 21 is supplied to an inversion clock input terminal of the first flip-flop FF0. A first countup completion output signal Cntr_UP supplied to the one-shot pulse generator (OSP) 23 is generated from an output terminal of the first OR circuit OR1.

Next, in the second counter circuit 22_DN, the second sampling output signal Samp_DN generated from the sampling circuit (Samp) 21 is supplied to an inversion clock input terminal of the first flip-flop FF0. A second countup completion output signal Cntr_DN supplied to the one-shot generator (OSP) 23 is generated from an output terminal of the first OR circuit OR1.

In each of the first and second counter circuits 22_UP and 22_DN, a reset signal RESET can be supplied in common to reset terminals of the five flip-flops from the first flip-flop FF0 to the fifth flip-flop FF4. Data output terminals Q of the first through fifth flip-flops FF0 to FF4 are coupled to their corresponding data input terminals D via the inverters.

Namely, the data output terminal Q0 of the first flip-flop FF0 is coupled to the data input terminal D0 via the first inverter Inv0. Subsequently, in the same manner as above, the data output terminal Q4 of the fifth flip-flop FF4 is coupled to the data input terminal D4 via the fifth inverter Inv4. Further, the data output terminal Q0 of the first flip-flop FF0 is coupled to an inversion clock input terminal of the second flip-flop FF1. Subsequently, in the same manner as above, the data output terminal Q3 of the fourth flip-flop FF3 is coupled to an inversion clock input terminal of the fifth flip-flop FF4. Furthermore, a quarternary counter overflow selection signal COUNT4 is supplied to a first input terminal of the first AND circuit AND1, an octernary counter overflow selection signal COUNT8 is supplied to a first input terminal of the second AND circuit AND2, and an hexadecimal counter overflow selection signal COUNT16 is supplied to a first input terminal of the third AND circuit AND3. The data output terminal Q2 of the third flip-flop FF2 is coupled to a second input terminal of the first AND circuit AND1. The data output terminal Q3 of the fourth flip-flop FF3 is coupled to a second input terminal of the second AND circuit AND2. The data output terminal Q4 of the fifth flip-flop FF4 is coupled to a second input terminal of the third AND circuit AND3.

First, in each of the first counter circuit 22_UP and the second counter circuit 22_DN, a reset signal RESET of a high level is supplied in common to the reset terminals of the five flip-flops from the first flip-flop FF0 to the fifth flip-flop FF4 so that the data output terminals Q of the first to fifth flip-flops FF0 to FF4 are reset. As a result, the data input terminals D of the first to fifth flip-flops FF0 to FF4 are respectively maintained at a low level.

At timings of falling edges of the input signals supplied to the inversion clock input terminals of the first to fifth flip-flops FF0 to FF4 of each of the first counter circuit 22_UP and the second counter circuit 22_DN, the amplitude levels of the data input terminals D are sampled and held to thereby generate output data Q.

Operation of Counter

Figure 6:
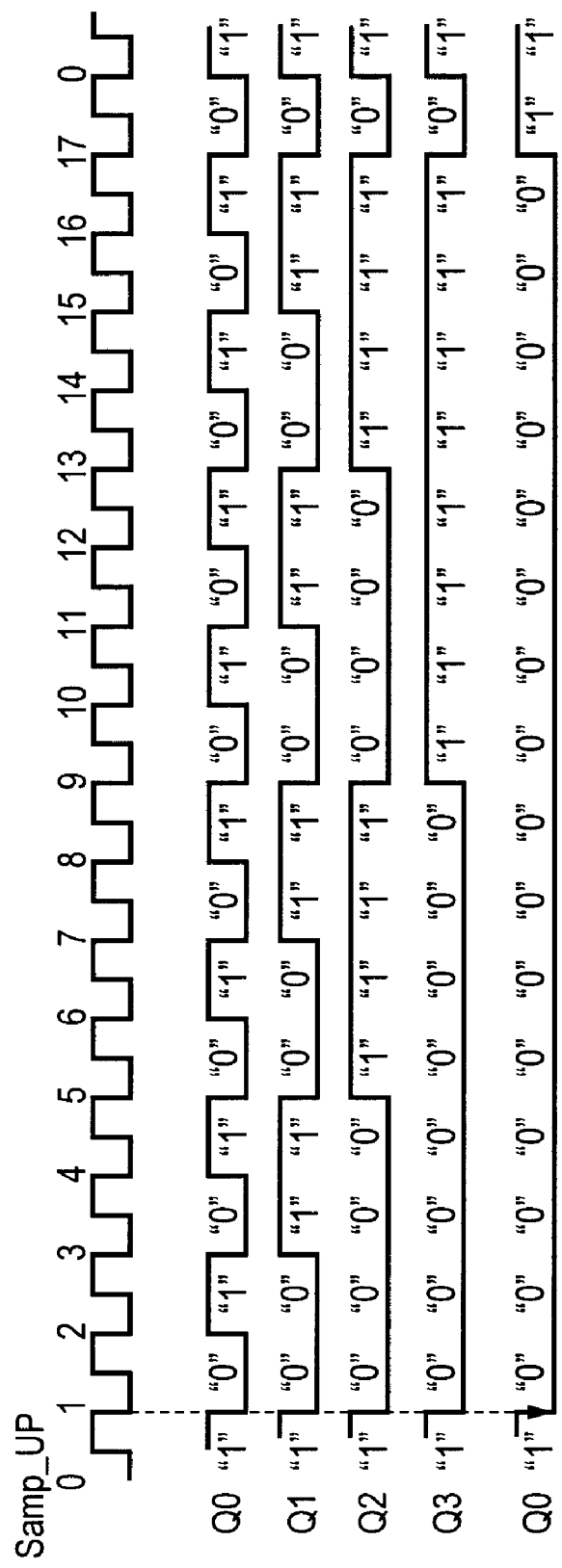
FIG. 6 is a diagram for describing the operation of the counter (Cntr) 22 shown in FIG. 5.

FIG. 6 is a diagram for describing the operation of the counter (Cntr) 22 according to the first embodiment of the present invention, which is shown in FIG. 5.

Incidentally, FIG. 6 shows the operation of the first counter circuit 22_UP where a high level period of the first output signal UP is longer than that of the second output signal DN with respect to the first output signal UP and the second output signal DN generated from the phase frequency comparator (PFD) 1.

First, in the five flip-flops from the first flip-flop FF0 to the fifth flip-flop FF4 of the first counter circuit 22_UP, the data output terminals Q0 to Q4 are respectively reset to a high level by the high-level reset signal RESET.

At a timing of a first change from a high level "1" of the first sampling output signal Samp_UP supplied from the sampling circuit (Samp) 21 to the inversion clock input terminal of the first flip-flop FF_0 to a low level "0" thereof, the data output terminal Q0 is changed from a high level "1" to a low level "0" in response to the data input terminal D0 low in level.

Next, at the timing of the change from the high level "1" to the low level "0" of the signal at the data output terminal Q0 supplied from the first flip-flop FF0 to the inversion clock input terminal of the second flip-flop FF1, the data output terminal Q1 is changed from a high level "1" to a low level "0" in response to the data input terminal D1 low in level.

At a timing of a change from a high level "1" to a low level "0" of the signal at the data output terminal Q1 supplied from the second flip-flop FF1 to the inversion clock input terminal of the third flip-flop FF2, the data output terminal Q2 is changed from a high level "1" to a low level "0" in response to the data input terminal D2 low in level.

Next, at a timing of a change from a high level "1" to a low level "0" of the signal at the data output terminal Q2 supplied from the third flip-flop FF2 to the inversion clock input terminal of the fourth flip-flop FF3, the data output terminal Q3 is changed from a high level "1" to a low level "0" in response to the data input terminal D3 low in level.

At a timing of the change from the high level "1" to the low level "0" of the signal at the data output terminal Q3 supplied from the fourth flip-flop FF3 to the inversion clock input terminal of the fifth flip-flop FF4, the data output terminal Q4 is changed from a high level "1" to a low level "0" in response to the data input terminal D4 low in level.

Thus, the state from the fifth flip-flop FF4 of the first counter circuit 22_UP to the first flip-flop FF0 thereof becomes "00000" according to the first change from the high level "1" to the low level "0" of the first sampling output signal Samp_UP.

At a timing of a second change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of a high level "1". Thus, a ½-division output signal of the first sampling output signal Samp_UP is generated at the data output terminal Q0 of the first flip-flop FF0 in response to the change from the high level "1" of the first sampling output signal Samp_UP to the low level "0" thereof.

Thus, the state from the fifth flip-flop FF4 of the first counter circuit 22_UP to the first flip-flop FF0 thereof becomes "00001" according to the second change from the high level "1" of the first sampling output signal Samp_UP to the low level "0" thereof.

At a timing of a third change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of a low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a low level "0" to a high level "1" in response to the data input terminal D1 of a high level "1". Thus, a ½-division output signal of the signal of the data output terminal Q0 of the first flip-flop FF0 is generated at the data output terminal Q1 of the second flip-flop FF1 in response to the change from the high level "1" of the first sampling output signal Samp_UP to the low level "0" thereof.

Thus, the state from the fifth flip-flop FF4 of the first counter circuit 22_UP to the first flip-flop FF0 thereof becomes "00010" according to the third change from the high level "1" of the first sampling output signal Samp_UP to the low level "0" thereof.

At a timing of a fourth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "00011" according to the fourth change from the high level "1" of the first sampling output signal Samp_UP to the low level "0" thereof.

At a timing of a fifth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a high level "1" to a low level "0" in response to the data input terminal D1 of a low level "0". Then, at a timing of a change from a high level "1" of the signal of the data output terminal Q1 supplied from the second flip-flop FF12 to the inversion clock input terminal of the third flip-flop FF2 to a low level "0" thereof, the data output terminal Q2 is changed from a low level "0" to a high level "1" in response to the data input terminal D2 of a high level "1". Thus, a ½-division output signal of the signal of the data output terminal Q1 of the second flip-flop FF1 is generated from the data output terminal Q2 of the third flip-flop FF2 in response to the change from the high level "1" of the first sampling output signal Samp_UP to the low level "0" thereof.

Thus, the state from the fifth flip-flop FF4 of the first counter circuit 22_UP to the first flip-flop FF0 thereof becomes "00100" according to the fifth change from the high level "1" of the first sampling output signal Samp_UP to the low level "0" thereof.

At a timing of a sixth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "00101" according to the sixth change from the high level "1" of the first sampling output signal Samp_UP to the low level "0" thereof.

At a timing of a seventh change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a low level "0" to a high level "1" in response to the data input terminal D1 of the high level "1".

Thus, the state from the fifth flip-flop FF4 of the first counter circuit 22_UP to the first flip-flop FF0 thereof becomes "00110" according to the seventh change from the high level "1" of the first sampling output signal Samp_UP to the low level "0" thereof.

At a timing of an eighth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "00111" according to the eighth change from the high level "1" of the first sampling output signal Samp_UP to the low level "0" thereof.

At a timing of a ninth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 low in level.

Next, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a high level "1" to a low level "0" in response to the data input terminal D1 low in level.

At the timing of the change from the high level "1" of the signal of the data output terminal Q1 supplied from the second flip-flop FF1 to the inversion clock input terminal of the third flip-flop FF2 to the low level "0" thereof, the data output terminal Q2 is changed from a high level "1" to a low level "0" in response to the data input terminal D2 low in level.

Next, at the timing of the change from the high level "1" of the signal of the data output terminal Q2 supplied from the third flip-flop FF2 to the inversion clock input terminal of the fourth flip-flop FF3 to the low level "0" thereof, the data output terminal Q3 is changed from a low level "0" to a high level "1" in response to the data input terminal D3 of a high level "1". Thus, a ½-division output signal of the signal of the data output terminal Q2 of the third flip-flop FF2 is generated from the data output terminal Q3 of the fourth flip-flop FF3 in response to the change from the high level "1" of the first sampling output signal Samp_UP to the low level "0" thereof.

Thus, the state from the fifth flip-flop FF4 of the first counter circuit 22_UP to the first flip-flop FF0 thereof becomes "01000" according to the ninth change from the high level "1" of the first sampling output signal Samp_UP to the low level "0" thereof.

At a timing of a tenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "01001" according to the tenth change from the high level "1" of the first sampling output signal Samp_UP to the low level "0" thereof.

At a timing of an eleventh change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a low level "0" to a high level "1" in response to the data input terminal D1 of the high level "1".

Thus, the state from the fifth flip-flop FF4 of the first counter circuit 22_UP to the first flip-flop FF0 thereof becomes "01010" according to the eleventh change from the high level "1" of the first sampling output signal Samp_UP to the low level "0" thereof.

At a timing of a twelfth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "01011" according to the twelfth change from the high level "1" of the first sampling output signal Samp_UP to the low level "0" thereof.

At a timing of a thirteenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a high level "1" to a low level "0" in response to the data input terminal D1 of the low level "0". Then, at the timing of the change from the high level "1" of the signal of the data output terminal Q1 supplied from the second flip-flop FF12 to the inversion clock input terminal of the third flip-flop FF2 to the low level "0" thereof, the data output terminal Q2 is changed from a low level "0" to a high level "1" in response to the data input terminal D2 of the high level "1".

Thus, the state from the fifth flip-flop FF4 of the first counter circuit 22_UP to the first flip-flop FF0 thereof becomes "01100" according to the thirteenth change from the high level "1" of the first sampling output signal Samp_UP to the low level "0" thereof.

At a timing of a fourteenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "01101" according to the fourteenth change from the high level "1" of the first sampling output signal Samp_UP to the low level "0" thereof.

At a timing of a fifteenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level "0". As a result, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a low level "0" to a high level "1" in response to the data input terminal D1 of the high level "1".

Thus, the state from the fifth flip-flop FF4 of the first counter circuit 22_UP to the first flip-flop FF0 thereof becomes "01110" according to the fifteenth change from the high level "1" of the first sampling output signal Samp_UP to the low level "0" thereof.

At a timing of a sixteenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a low level "0" to a high level "1" in response to the data input terminal D0 of the high level "1".

Thus, the state from the fifth flip-flop FF4 of the first counter circuit 22_UP to the first flip-flop FF0 thereof becomes "01111" according to the sixteenth change from the high level "1" of the first sampling output signal Samp_UP to the low level "0" thereof.

At a timing of a seventeenth change from a high level "1" of the first sampling output signal Samp_UP supplied from the sampling circuit (Samp) 21 to the inversion clock input terminal of the first flip-flop FF0 to a low level "0" thereof, the data output terminal Q0 is changed from a high level "1" to a low level "0" in response to the data input terminal D0 of the low level.

Next, at the timing of the change from the high level "1" of the signal of the data output terminal Q0 supplied from the first flip-flop FF0 to the inversion clock input terminal of the second flip-flop FF1 to the low level "0" thereof, the data output terminal Q1 is changed from a high level "1" to a low level "0" in response to the data input terminal D1 low in level.

At the timing of the change from the high level "1" of the signal of the data output terminal Q1 supplied from the second flip-flop FF1 to the inversion clock input terminal of the third flip-flop FF2 to the low level "0" thereof, the data output terminal Q2 is changed from a high level "1" to a low level "0" in response to the data input terminal D2 low in level.

Next, at the timing of the change from the high level "1" of the signal of the data output terminal Q2 supplied from the third flip-flop FF2 to the inversion clock input terminal of the fourth flip-flop FF3 to the low level "0" thereof, the data output terminal Q3 is changed from a high level "1" to a low level "0" in response to the data input terminal D3 low in level.

At the timing of the change from the high level "1" of the signal of the data output terminal Q3 supplied from the fourth flip-flop FF3 to the inversion clock input terminal of the fifth flip-flop FF4 to the low level "0" thereof, the data output terminal Q4 is changed from a low level "0" to a high level "1" in response to the data input terminal D4 of a high level "1".

In this way, the state from the fifth flip-flop FF4 of the first counter circuit 22_UP to the first flip-flop FF0 thereof becomes "10000" according to the seventeenth change from the high level "1" of the first sampling output signal Samp_UP to the low level "0" thereof. Thus, the state "10000" of the first counter circuit 22_UP that has responded to the seventeenth change from the high level "1" of the first sampling output signal Samp_UP to the low level "0" thereof becomes an overflow output signal of a hexadecimal counter. When the countup of the predetermined number of pulse signals of the sampling pulse SPL_CLK is completed by the countup of the counter (Cntr) 22, the counter (Cntr) 22 generates a countup completion output signal. That is, when the counter (Cntr) 22 completes the countup of seventeen pulse signals corresponding to the predetermined number of the sampling pulse SPL_CLK is completed, a signal of a high level "1" is generated at the data output terminal Q4 of the fifth flip-flop FF4. The signal of the high level "1" generated at the data output terminal Q4 of the fifth flip-flop FF4 is outputted as a first countup completion output signal Cntr_UP via the third AND circuit AND3 supplied with a hexadecimal counter overflow selection signal COUNT16. Further, the first countup completion output signal Cntr_UP of this high level "1" is supplied in common to the reset terminals of the five flip-flops from the first flip-flop FF0 of the first counter circuit 22_UP to the fifth flip-flop FF4 thereof as a reset signal RESET, so that the data output terminals Q0 to Q4 of the first flip-flop FF0 to the fifth flip-flop FF4 are reset to the high level "1". Thus, the counter (Cntr) 22 is capable of starting the countup of the pulse signals of the sampling pulse SPL_CLK again by the reset by the flip-flops FF0 through FF4 of the first counter circuit 22_UP, based on the first countup completion output signal Cntr_UP (reset signal RESET) generated with the completion of the countup of the predetermined number of pulse signals of the sampling pulse SPL_CLK by the counter (Cntr) 22.

Further, the counter (Cntr) 22 is capable of not only generating the overflow output signal of the hexadecimal counter but also generating an overflow output signal of the quarternary counter and an overflow output signal of the octernary counter.

That is, the overflow output signal of the hexadecimal counter is generated from the output of the third AND circuit AND3 supplied with the hexadecimal counter overflow selection signal COUNT16. The overflow output signal of the octernary counter is generated from the output of the second AND circuit AND2 supplied with the octernary counter overflow selection signal COUNT8. The overflow output signal of the quarternary counter is generated from the output of the first AND circuit AND1 supplied with the quarternary counter overflow selection signal COUNT4.

Configuration of One-Shot Pulse Generator

FIG. 7 is a diagram showing a configuration of the one-shot pulse generator (OSP) 23 of the loop attenuator (LA) 2 of the PLL circuit according to the first embodiment of the present invention shown in FIG. 1.

As shown in FIG. 7, the one-shot pulse generator (OSP) 23 is comprised of a first one-shot pulse generating circuit 23_UP which is supplied with the first countup completion output signal Cntr_UP generated from the counter (Cntr) 22 to thereby generate a first one-shot pulse output signal OSP_UP supplied to the charge pump (CP) 3, and a second one-shot pulse generating circuit 23_DN which is supplied with the second countup completion output signal Cntr_DN generated from the counter (Cntr) 22 to thereby generate a second one-shot pulse output signal OSP_DN supplied to the charge pump (CP) 3.

Each of the first and second one-shot pulse generating circuits 23_UP and 23_DN is comprised of a first flip-flop FF1, a second flip-flop FF2, an inverter Inv1, an exclusive-OR circuit EX-OR and an AND circuit AND.

First, in the first one-shot pulse generating circuit 23_UP, the first countup completion output signal Cntr_UP generated from the counter (Cntr) 22 is supplied to a data input terminal D1 of the first flip-flop FF1 and a data input terminal D2 of the second flip-flop FF2. The sampling pulse SPL_CLK is supplied to a clock input terminal CLK1 of the first flip-flop FF1 and an input terminal of the inverter Inv1. An inverted sampling pulse /SPL_CLK generated at an output terminal of the inverter Inv1 is supplied to a clock input terminal CLK2 of the second flip-flop FF2. The first countup completion output signal Cntr_UP and an output signal of the exclusive-OR circuit EX-OR are respectively supplied to first and second input terminals of the AND circuit AND. Thus, a first one-shot pulse output signal OSP_UP supplied to the charge pump (CP) 3 is generated from an output terminal of the AND circuit AND.

Next, in the second one-shot pulse generating circuit 23_DN, the second countup completion output signal Cntr_DN generated from the counter (Cntr) 22 is supplied to a data input terminal D1 of the first flip-flop FF1 and a data input terminal D2 of the second flip-flop FF2. The sampling pulse SPL_CLK is supplied to a clock input terminal CLK1 of the first flip-flop FF1 and an input terminal of the inverter Inv1. An inverted sampling pulse /SPL_CLK generated at an output terminal of the inverter Inv1 is supplied to a clock input terminal CLK2 of the second flip-flop FF2. The second countup completion output signal Cntr_DN and an output signal of the exclusive-OR circuit EX-OR are respectively supplied to first and second input terminals of the AND circuit AND. Thus, a second one-shot pulse output signal OSP_DN supplied to the charge pump (CP) 3 is generated from an output terminal of the AND circuit AND.

In each of the first one-shot pulse generating circuit 23_UP and the second one-shot pulse generating circuit 23_DN, the inverted sampling pulse /SPL_CLK generated from the output terminal of the inverter Inv1 is supplied to the input terminal corresponding to the clock input terminal CLK2 of the second flip-flop FF2. Output data Q1 of the first flip-flop FF1 and output data Q2 of the second flip-flop FF2 are respectively supplied to first and second input terminals of the exclusive-OR circuit EX-OR.

Operation of One-Shot Pulse Generator

FIG. 8 is a diagram for describing the operation of the one-shot pulse generator (OSP) 23 according to the first embodiment of the present invention, which is shown in FIG. 7.

Incidentally, FIG. 8 shows the operation of the first one-shot pulse generating circuit 23_UP where a high level period of the first output signal UP is longer than that of the second output signal DN with respect to the first output signal UP and the second output signal DN generated from the phase frequency comparator (PFD) 1.

First, as shown in FIG. 8, the first countup completion output signal Cntr_UP generated from the counter (Cntr) 22 is changed from a low level "0" to a high level "1".

First, the first flip-flop FF1 of the first one-shot pulse generating circuit 23_UP samples and holds a high level "1" of the first countup completion output signal Cntr_UP of the counter (Cntr) 22 at a timing of a rising edge of the sampling pulse SPL_CLK and thereby generates output data Q1 of a high level "1".

Next, the second flip-flop FF2 of the first one-shot pulse generating circuit 23_UP samples and holds a high level "1" of the first countup completion output signal Cntr_UP of the counter (Cntr) 22 at a timing of a rising edge of the inverted sampling pulse /SPL_CLK and thereby generates output data Q2 of a high level "1".

The exclusive-OR circuit EX-OR generates an exclusive-OR output signal in response to the output data Q1 of the first flip-flop FF1 and the output data Q2 of the second flip-flop FF2. The exclusive-OR output signal generated from the exclusive-OR circuit EX-OR includes a first one-shot pulse signal of a high level "1" having responded to a change from the low level "0" of the first countup completion output signal Cntr_UP to the high level "1" thereof, and a second one-shot pulse signal of a high level "1" having responded to a change from the high level "1" of the first countup completion output signal Cntr_Up to the low level "0" thereof.

The second one-shot pulse signal of the high level "1" in the output signal of the exclusive-OR circuit EX-OR is masked by AND processing of both the first countup completion output signal Cntr_UP and the output signal of the exclusive-OR circuit EX-OR by the AND circuit AND of the first one-shot pulse generating circuit 23_UP. The first one-shot pulse signal of the high level "1" in the output signal of the exclusive-OR circuit EX-OR is outputted as a first one-shot pulse output signal OSP_UP.

It can be seen from the above description and FIGS. 2, 7 and 8 that the one-shot pulse generator (OSP) 23 outputs a signal (e.g., OSP_UP) in response to the loop attenuator 2 receiving a phase-compared signal (e.g. 11) of constant value and sufficient duration reflecting a sufficiently continuous phase lag of the feedback signal 9 relative to the reference signal 8.

Configuration of Charge Pump

Figure 9:
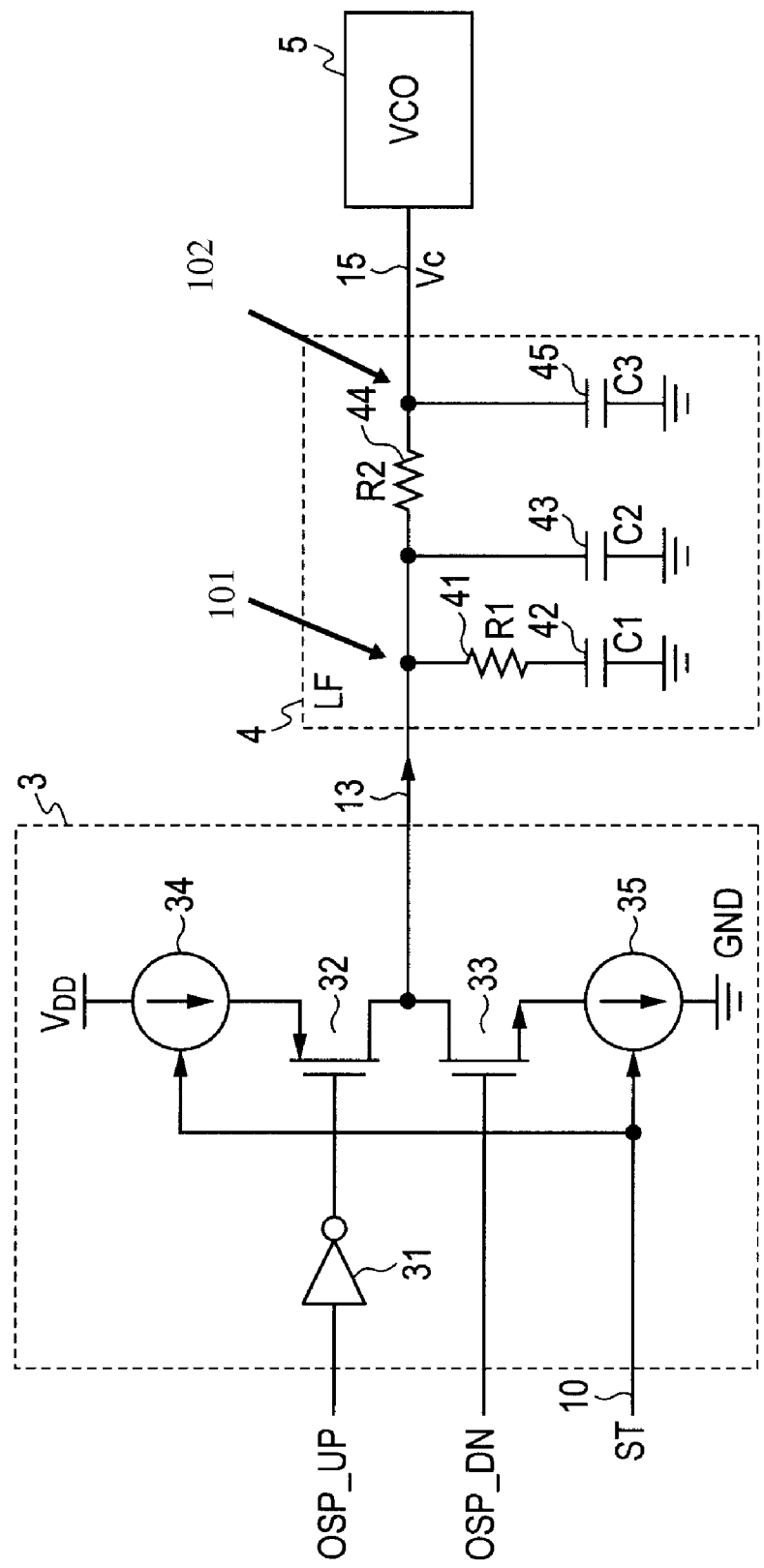
FIG. 9 is a diagram showing a configuration of a charge pump (CP) 3 in the PLL circuit shown in FIG. 1.

FIG. 9 is a diagram showing a configuration of the charge pump (CP) 3 of the PLL circuit according to the first embodiment of the present invention shown in FIG. 1.

The charge pump (CP)3 shown in FIG. 9 includes an inverter 31, a charging-side current source 34, a charging-side switch 32, a discharging-side switch 33 and a discharging-side current source 35. A charging current of the charging-side current source 34 and a discharging current of the discharging-side current source 35 are the same current value. The charging-side switch 32 is controlled by the first one-shot pulse output signal OSP_UP supplied from the one-shot pulser generator (OSP) 23. The discharging-side switch 33 is controlled by the second one-shot pulse output signal OSP_DN supplied from the one-shot pulse generator (OSP) 23.

In a standby state, the charging current of the charging-side current source 34 and the discharging current of the discharging-side current source 35 are controlled to zero by a high level standby signal (ST) 10.

During a high-speed lock response operation and a steady lock operation, the charging-side switch 32 is controlled to an on state by the first one-shot pulse output signal OSP_UP as an up signal during a charging operation. Therefore, the charging current of the charging-side current source 34 is outputted to the input node 13 of the loop filter (LF) 4 so that an electric charge is charged into the filter capacitor 42. On the other hand, since the discharging-side switch 33 is controlled to an on state by the second one-shot pulse output signal OSP_DN as a down signal during a discharging operation, the electrical charge of the filter capacitor 42 is discharged via the input node 13 by the discharging current of the discharging-side current source 35.

Second Embodiment

Configuration of Fractional PLL Circuit

FIG. 10 is a diagram for describing a configuration of a PLL circuit on-chip integrated into a semiconductor integrated circuit according to a second embodiment of the present invention.

The PLL circuit according to the second embodiment of the present invention shown in FIG. 10 is configured as a fractional PLL circuit that configures a spread spectrum clock generator (SSCG) used in a serial ATA interface unit.

The PLL circuit according to the second embodiment of the present invention shown in FIG. 10 is different from the PLL circuit according to the first embodiment of the present invention shown in FIG. 1 in that a signal waveform generator (SWG) 19 and a modulator (ΣΔMOD) 18 are added to the PLL circuit of FIG. 1.

The signal waveform generator (SWG) 19 generates a modulating signal and outputs it to the modulator (ΣΔMOD) 18. The modulator (ΣΔMOD) 18 converts the modulating signal to a discrete value as an instantaneous division number. For example, a ΣΔ modulator ("delta-sigma modulator") or the like is suitable as for the modulator (ΣΔMOD) 18. The modulator is however not limited to it. A division ratio of the divider (N) 6 supplied with an output signal of the modulator (ΣΔMOD) 18 is periodically changed from an integer N to an integer N+1. Consequently, an average division ratio becomes the sum of an integral part and a fractional part.

Figure 11:
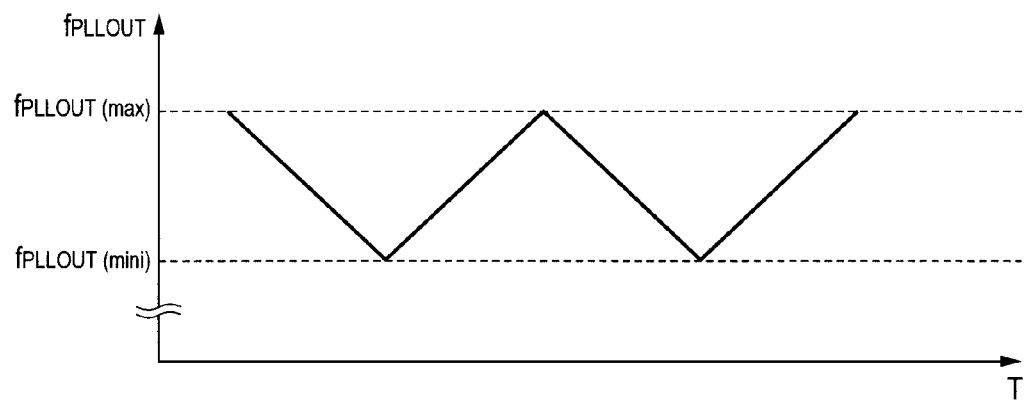
FIG. 11 is a diagram showing how a frequency $f_{PLLOUT}$ of a PLL output signal generated from the fractional PLL circuit that configures the spread spectrum clock generator (SSCG) shown in FIG. 10 changes with time.

FIG. 11 is a diagram showing how the frequency $f_{PLLOUT}$ of a PLL output signal generated from the fractional PLL circuit that configures the spread spectrum clock generator (SSCG) shown in FIG. 10 changes.

As shown in the same figure, the frequency $f_{PLLOUT}$ of the PLL output signal frequency-modulated by the modulator (ΣΔMOD) 18 linearly changes between the maximum value $f_{PLLOUT}(max)$ and the minimum value $f_{PLLOUT}(mini)$. The amount of change in frequency between the maximum value $f_{PLLOUT}(max)$ and the minimum value $f_{PLLOUT}(mini)$ becomes, for example, an approximately 0.5% to 5% of the maximum value $f_{PLLOUT}(max)$.

Figure 12:
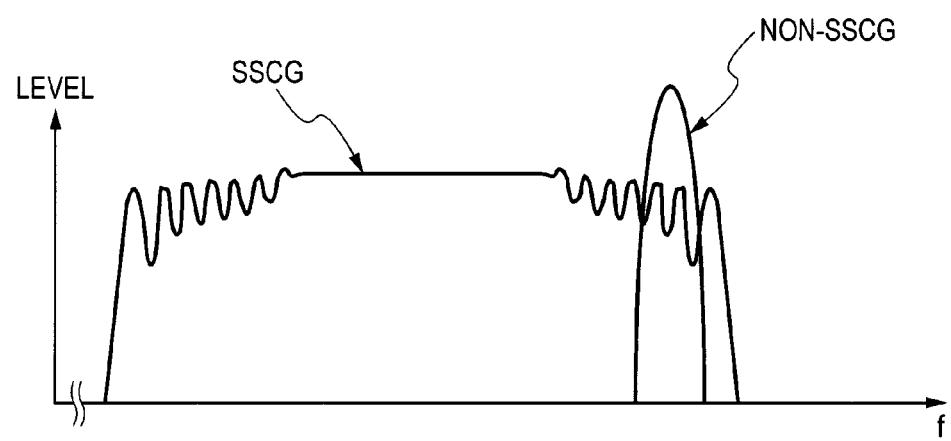
FIG. 12 is a diagram illustrating a frequency spectrum of the PLL output signal generated from the fractional PLL circuit that configures the spread spectrum clock generator (SSCG) shown in FIG. 10.

FIG. 12 is a diagram showing a frequency spectrum of the PLL output signal generated from the fractional PLL circuit that configures the spread spectrum clock generator (SSCG) shown in FIG. 10.

A characteristic SSCG of FIG. 12 is spread over a wide frequency band of the PLL output signal generated as a system clock signal from the fractional PLL circuit that configures the spread spectrum clock generator (SSCG) shown in FIG. 10, and shows that peak energy can be reduced. Incidentally, a characteristic Non-SSCG of FIG. 12 shows a frequency characteristic of a general clock generator having extremely high peak energy.

The spread spectrum clock generator (SSCG) according to the second embodiment of the present invention shown in FIG. 10 controls the operation of the charge pump (CP) 3 by means of the controller (CNT) 7. Thus, while maintaining important performance of the PLL circuit as a spectrum diffusion clock generator, such as output jitter, the amount of EMI suppression, etc., a settling time can be greatly shortened, and the loop filter (LF) 4 can be on-chipped.

Further Embodiment

Recording and Reproducing Unit

FIG. 13 is a diagram showing a configuration of a recording and reproducing unit 34 according to a further embodiment of the present invention, which is coupled to a host computer as a peripheral device.

In the recording and reproducing unit 34 of FIG. 13, the on-chip integrated PLL circuit according to the first embodiment of the present invention shown in FIG. 1 has been adopted in a write strategy PLL circuit (WSPLL) 46 and a reference clock generation PLL circuit (MCKPLL) 51 that generates a reference clock CLK.

In FIG. 13, an optical disc device is comprised of an optical disc 29, an optical pick-up 30, a semiconductor integrated circuit 31 and a crystal oscillator 33 which provides a reference signal. The optical disc device is coupled to a host computer (HOST) 32 by a serial ATAPI system. Incidentally, ATAPI is an abbreviation of Advanced Technology Attachment Peripheral Interface.

The optical pick-up 30 applies a light beam onto the optical disc 29 to perform reading and writing of data therefrom and therein. The semiconductor integrated circuit 31 includes a recording and reproducing unit (READ/WRITE) 34 which executes the processing of writing of data into the optical disc 30 and reading of data therefrom, and an interface unit (ATAPI) 36 for performing the input/output of the data of the recording and reproducing unit 34 to and from the host computer (HOST) 32. Incidentally, the serial ATA type interface unit (ATAPI) 36 of FIG. 13 can be configured in exactly the same manner as an interface unit (ATAPI) 36 shown in FIG. 14 to be described below.

The recording and reproducing unit (READ/WRITE) 34 of the semiconductor integrated circuit 31 shown in FIG. 13 includes an analog front end (AFE) 45 which waveform-shapes a noisy signal produced by the optical pick-up 30, a write strategy PLL circuit (WSPLL) 46 which performs a recording operation, and a write strategy circuit (WriteSTR) 47.

A read operation is carried out by a PRML timing circuit 49 and a read logic circuit (LOGIC) 50. That is, the PRML timing circuit 49 and the read logic circuit (LOGIC) 50 configure a PRML decoder used for reading. Incidentally, PRML is an abbreviation of Partial Response Mostly Likelihood.

Further, the recording and reproducing unit 34 includes a servo circuit (SRV) 48 which rotates the disc 29 at a specified rotational speed, and a reference clock generation PLL circuit (MCKPLL) 51 which generates a reference clock CLK for operating all internal circuits of the semiconductor integrated circuit 31.

A noisy signal produced by the optical pick-up 30 is a signal that is affected by dust or the like attached onto the disc 29 and large in noise. This signal is therefore waveform-shaped by the analog front end (AFE) 45.

Next, the signal synchronized with the rotation of the disc 29 is supplied to the write strategy PLL circuit (WSPLL) 46, which generates a frequency/phase-synchronized multiphase clock signal. The multiphase clock signal actually includes a number of clock signals (e.g., 16 or 32 in number). A difference in phase between two clock signals adjacent to each other, of the multiphase clock signal becomes a value obtained by dividing one cycle by the number of clock signals. That is, if the number of clock signals is 16, the value results in one cycle/16. If the number of clock signals is 32, the value results in one cycle/32.

The multiphase clock signal generated from the write strategy PLL circuit (WSPLL) 46 is supplied to the write strategy circuit (WriteSTR) 47. The write strategy circuit (WriteSTR) 47 changes the length of data of a signal for writing into the disc 29 written via the optical pick-up 30 using the multiphase clock signal. The frequency of the rotation-synchronized signal from the disc 29 supplied to the write strategy PLL circuit (WSPLL) 46 changes according to a change in the rotational speed of the disc 29 with respect to a series of operations described above. That is, the write strategy PLL circuit (WSPLL) 46 needs to have a large operating frequency width.

Thus, in the recording and reproducing unit 34 according to the further embodiment of the present invention shown in FIG. 13, the on-chip integrated PLL circuit according to the first embodiment of the present invention shown in FIG. 1 is adopted as the write strategy PLL circuit (WSPLL) 46 and has the required large operating frequency width. In a normal PLL circuit having a digital-analog converter (DAC), the circuit scale of the digital-analog converter (DAC) increases to cover a large frequency range. On the other hand, since there is no digital-analog converter (DAC) in the write strategy PLL circuit (WSPLL) 46 shown in FIG. 13 (which instead has the on-chip integrated PLL circuit according to the first embodiment of the present invention shown in FIG. 1), the write strategy PLL circuit (WSPLL) 46 can have a smaller circuit size.

Further, in the recording and reproducing unit 34 according to the further embodiment of the present invention shown in FIG. 13, the on-chip integrated PLL circuit according to the first embodiment of the present invention shown in FIG. 1 is adopted as the reference clock generation PLL circuit (MCK-PLL) 51 that generates the reference clock CLK. Thus, when the loop filter of the PLL circuit is on-chipped, it is possible to reduce variations in the characteristics of the PLL circuit due to variations in the device size of each transistor and reduce increases in both circuit scale and power consumption of the semiconductor integrated circuit.

Interface Unit

FIG. 14 is a diagram showing a configuration of the interface unit 36 according to another embodiment of the present invention, which is coupled to a host computer 32 as a peripheral device.

In the serial ATA type interface unit 36 of FIG. 14, the on-chip integrated PLL circuit according to the first embodiment of the present invention shown in FIG. 1 is adopted as a first PLL circuit 41. Further, the fractional PLL circuit according to the second embodiment of the present invention shown in FIG. 10 is adopted as a second PLL circuit 40.

Upon the processing of reading data from an optical disc used as a peripheral device, a serializer (SER) 39 used as a parallel-serial converter converts parallel transmission data sent from the recording and reproducing unit 34 into a serial transmission signal synchronized with a clock supplied from the second PLL circuit 40 and outputs it to the host computer 32.

Upon the processing of writing data into the optical disc used as the peripheral disc, a clock data reproduction unit 38 receives a reception signal from the host computer 32 to generate serial reproduction data and a reproduction clock in response to a clock supplied from the first PLL circuit 41 and outputs them to a deserializer (DES) 37. The deserializer (DES) 37 used as a serial-parallel converter performs the processing of generating parallel reception data from the serial reproduction data and the reproduction clock and writing data into the optical disc 29.

The serial ATA type interface unit shown in FIG. 14 will be explained below in detail.

Generally, as an interface for coupling storage media (peripheral devices) such as an optical disc device, a hard disc device, etc. to a computer such as a personal computer, there is known, for example, a serial ATA type interface unit based on the standard. With the use of the serial ATA, various storage media can be coupled to the computer under commands having compatibility and control software. In the interface unit shown in FIG. 14, the optical disc device is adopted as the storage media, and the peripheral device is coupled to the host computer by the serial ATAPI.

In FIG. 14, the optical disc device is comprised of an optical disc 29, an optical pick-up 30, a semiconductor integrated circuit 31 and a crystal oscillator 33 that provides a reference signal. The optical disc device is coupled to the host computer (HOST) 32 by the serial ATAPI system.

The optical pick-up 30 applies a light beam onto the optical disc 29 to perform reading and writing of data therefrom and therein. The semiconductor integrated circuit 31 includes a recording and reproducing unit (READ/WRITE) 34 which executes the processing of writing of data into the optical disc 30 and reading of data therefrom, and an interface unit (ATAPI) 36 for performing the input/output of the data of the recording and reproducing unit 34 to and from the host computer (HOST) 32.

The interface unit (ATAPI) 36 is comprised of the serializer (SER) 39, first PLL circuit 41, second PLL circuit 40, deserializer (DES) 37, and clock data reproduction unit (CDR) 38.

Upon the processing of reading data from the optical disc 29, the serializer (SER) 39 of the interface unit (ATAPI) 36 converts parallel transmission data sent from the recording and reproducing unit 34 into a serial transmission signal (TX) synchronized with the clock (CLK) supplied from the second PLL circuit 40 and outputs it to the host computer 32.

Upon the processing of writing data into the optical disc 29, the clock data reproduction unit (CDR) 38 of the interface unit (ATAPI) 36 receives a reception signal (RX) from the host computer 32 to generate serial reproduction data (DATA) and a reproduction clock (CLK) in response to a clock (CLK) supplied from the first PLL circuit 41 and outputs them to the deserializer (DES) 37. The deserializer (DES) 37 executes the processing of generating parallel reception data from the serial reproduction data (DATA) and the reproduction clock (CLK), outputting it to the recording and reproducing unit 34 and writing data into the optical disc 29.

While the invention made above by the present inventors has been described specifically on the basis of the various embodiments, the present invention is not limited to the embodiments referred to above. It is needless to say that various changes can be made thereto within the scope not departing from the gist thereof.

For example, the PLL circuit according to the present invention is not limited only to the generation of the clock signal for operating the logic circuit. In addition to the above, the present invention is applicable even to a PLL circuit for generating a transmission carrier signal for a transmission operation and a reception carrier signal for a reception operation in a transmitter-receiver of a wireless communication terminal such as a cellular phone, a wireless LAN or the like.

What is claimed is:

1. A semiconductor integrated circuit comprising:
a phase locked loop circuit built therein including:
   a phase frequency comparator;
   a loop attenuator;
   a charge pump;
   a loop filter;
   a voltage controlled oscillator; and
   a divider,
wherein the phase frequency comparator compares a difference in phase between a reference signal and a feedback signal that is an output signal of the divider and outputs a first output signal and a second output signal each used as a phase-compared output signal,
wherein the loop attenuator outputs a charge pump drive output signal supplied to the charge pump in response to the first output signal and the second output signal each used as the phase-compared output signal outputted from the phase frequency comparator,
wherein the charge pump outputs a charging current or a discharging current to the loop filter in response to the charge pump drive output signal outputted from the loop attenuator,
wherein the loop filter outputs a control voltage supplied to the voltage controlled oscillator in response to the charging current or the discharging current outputted from the charge pump,
wherein the voltage controlled oscillator outputs an oscillation output signal supplied to the divider in response to the control voltage outputted from the loop filter,
wherein the divider divides the oscillation output signal outputted from the voltage controlled oscillator to thereby output the feedback signal supplied to the phase frequency comparator,
wherein when the phase of the feedback signal lags the phase of the reference signal, a difference in pulse width between a first pulse having a long pulse width, of the first output signal and a second pulse having a short pulse width, of the second output signal corresponds to the lag in the phase between the reference signal and the feedback signal,
wherein the loop attenuator includes at least a sampling circuit and a counter,
wherein the sampling circuit is supplied with a sampling pulse and the first output signal and the second output signal outputted from the phase frequency comparator to thereby output a sampling output signal,
wherein when the phase of the feedback signal lags the phase of the reference signal, the sampling circuit outputs, as the sampling output signal, the sampling pulses supplied during a period of the pulse width of the first pulse of the first output signal outputted from the phase frequency comparator,
wherein when the counter completes a countup of a predetermined number of the sampling pulses outputted as the sampling output signal from the sampling circuit, the counter outputs a countup completion output signal, and
wherein the charge pump outputs the charging current or the discharging current to the loop filter in response to the countup completion output signal outputted from the counter of the loop attenuator.

2. The semiconductor integrated circuit according to claim 1,
wherein the counter is reset in response to the completion of the countup of the predetermined number of sampling pulses by the counter and the output of the countup completion output signal by the counter, and
wherein the reset counter restarts the countup of the sampling pulses outputted as the sampling output signal from the sampling circuit.

3. The semiconductor integrated circuit according to claim 2,
wherein the loop attenuator further includes a one-shot pulse generator, and
wherein the one-shot pulse generator is supplied with the sampling pulses and the countup completion output signal outputted from the counter to thereby output a one-shot pulse output signal having a pulse width approximately equal to that of the sampling pulse as the charge pump drive output signal.

4. The semiconductor integrated circuit according to claim 3,
wherein the one-shot pulse generator comprises a first flip-flop, a second flip-flop, an inverter, an exclusive-OR circuit and an AND circuit,
wherein the countup completion output signal outputted from the counter is supplied to a data input terminal of the first flip-flop and a data input terminal of the second flip-flop,
wherein the sampling pulse is supplied to a clock input terminal of the first flip-flop and an input terminal of the inverter,
wherein an inverted sampling pulse outputted from an output terminal of the inverter is supplied to a clock input terminal of the second flip-flop,
wherein output data of the first flip-flop and output data of the second flip-flop are respectively supplied to first and second input terminals of the exclusive-OR circuit, and
wherein the countup completion output signal and an output signal of the exclusive-OR circuit are respectively supplied to first and second input terminals of the AND circuit, and the one-shot pulse output signal is outputted from an output signal of the AND circuit.

5. The semiconductor integrated circuit according to claim 3, wherein the phase frequency comparator, the sampling circuit, the counter, the one-shot pulse generator, the charge pump, the loop filter and the divider are respectively controlled to a low power consumption state in response to a standby control signal of a predetermined level in a standby state.

6. The semiconductor integrated circuit according to claim 3, further including a controller which outputs a counter control signal supplied to the counter during a predetermined lapse period after the completion of the standby state, in response to the standby control signal having a level different from the predetermined level after the completion of the standby state,
wherein when the counter completes a countup of the sampling pulses smaller in number than the predetermined number of sampling pulses in response to the counter control signal outputted from the controller, the counter outputs the countup completion output signal during the predetermined lapse period after the completion of the standby state.

7. The semiconductor integrated circuit according to claim 3,
wherein the phase locked loop circuit further includes a modulator coupled to the divider, and wherein the divider changes between division numbers different in value in response to an output of the modulator, so that the phase locked loop circuit is operated in an operation mode of a fractional phase-locked loop (PLL) in which an average division number of the divider is the sum of an integral part and a fractional part.

8. The semiconductor integrated circuit according to claim 7, wherein the phase locked loop circuit is configured as spread spectrum clock generator in an on-chipped serial ATA interface unit.

9. The semiconductor integrated circuit according to claim 8, coupled between a storage disc device and a host device,
wherein, while the semiconductor integrated circuit reads a read signal from the storage disc device and supplies read data to the host device, the semiconductor integrated circuit receives write data from the host device and supplies a write signal to the storage disc device.

10. An operating method of a semiconductor integrated circuit which builds therein a phase locked loop circuit including a phase frequency comparator, a loop attenuator having a sampling circuit and a counter, a charge pump, a loop filter, a voltage controlled oscillator and a divider, comprising the steps of:
causing the phase frequency comparator to compare a difference in phase between a reference signal and a feedback signal that is an output signal of the divider and output a first output signal and a second output signal each used as a phase-compared output signal;
causing the loop attenuator to output a charge pump drive output signal supplied to the charge pump in response to the first output signal and the second output signal each used as the phase-compared output signal outputted from the phase frequency comparator;
causing the charge pump to output a charging current or a discharging current to the loop filter in response to the charge pump drive output signal outputted from the loop attenuator;
causing the loop filter to output a control voltage supplied to the voltage controlled oscillator in response to the charging current or the discharging current outputted from the charge pump;
causing the voltage controlled oscillator to output an oscillation output signal supplied to the divider in response to the control voltage outputted from the loop filter;
causing the divider to divide the oscillation output signal outputted from the voltage controlled oscillator to thereby output the feedback signal supplied to the phase frequency comparator;
when the phase of the feedback signal lags the phase of the reference signal, causing a difference in pulse width between a first pulse having a long pulse width, of the first output signal and a second pulse having a short pulse width, of the second output signal to correspond to the lag in the phase of the feedback signal with respect to the phase of the reference signal;
supplying a sampling pulse and the first output signal and the second output signal outputted from the phase frequency comparator to the sampling circuit to thereby cause the sampling circuit output a sampling output signal;
when the phase of the feedback signal lags the phase of the reference signal, causing the sampling circuit to output, as the sampling output signal, the sampling pulses supplied during a period of the pulse width of the first pulse of the first output signal outputted from the phase frequency comparator;
causing the counter to output a countup completion output signal when the counter completes a countup of a predetermined number of the sampling pulses outputted as the sampling output signal from the sampling circuit; and
causing the charge pump to output the charging current or the discharging current to the loop filter in response to the countup completion output signal outputted from the counter of the loop attenuator.

11. The operating method according to claim 10,
wherein the counter is reset in response to the completion of the countup of the predetermined number of sampling pulses by the counter and the output of the countup completion output signal by the counter, and
upon being reset, the counter restarts the countup of the sampling pulses outputted as the sampling output signal from the sampling circuit.

12. The operating method according to claim 11,
wherein the loop attenuator further includes a one-shot pulse generator, and
wherein the one-shot pulse generator is supplied with the sampling pulses and the countup completion output signal outputted from the counter to thereby output a one-shot pulse output signal having a pulse width approximately equal to that of the sampling pulse as the charge pump drive output signal.

13. The operating method according to claim 12,
wherein the one-shot pulse generator comprises a first flip-flop, a second flip-flop, an inverter, an exclusive-OR circuit and an AND circuit,
wherein the countup completion output signal outputted from the counter is supplied to a data input terminal of the first flip-flop and a data input terminal of the second flip-flop,
wherein the sampling pulse is supplied to a clock input terminal of the first flip-flop and an input terminal of the inverter,
wherein an inverted sampling pulse outputted from an output terminal of the inverter is supplied to a clock input terminal of the second flip-flop,
wherein output data of the first flip-flop and output data of the second flip-flop are respectively supplied to first and second input terminals of the exclusive-OR circuit, and
wherein the countup completion output signal and an output signal of the exclusive-OR circuit are respectively supplied to first and second input terminals of the AND circuit, and the one-shot pulse output signal is outputted from an output signal of the AND circuit.

14. The operating method according to claim 12,
wherein the phase frequency comparator, the sampling circuit, the counter, the one-shot pulse generator, the charge pump, the loop filter and the divider are respectively controlled to a low power consumption state in response to a standby control signal of a predetermined level in a standby state.

15. The operating method according to claim 12,
wherein the semiconductor integrated circuit further includes a controller which outputs a counter control signal supplied to the counter during a predetermined lapse period after the completion of the standby state, in response to the standby control signal having a level different from the predetermined level after the completion of the standby state, and
wherein when the counter completes a countup of the sampling pulses smaller in number than the predetermined number of sampling pulses in response to the counter control signal outputted from the controller, the counter outputs the countup completion output signal during the predetermined lapse period after the completion of the standby state.

16. The operating method according to claim 12,
wherein the phase locked loop circuit further includes a modulator coupled to the divider,
wherein the divider changes between division numbers different in value in response to an output of the modulator, and
wherein the phase locked loop circuit is operated in an operation mode of a fractional phase-locked loop (PLL) in which an average division number of the divider is the sum of an integral part and a fractional part.

17. The operating method according to claim 16, wherein the phase locked loop circuit is configured as a spread spectrum clock generator in an on-chipped serial ATA interface unit.

18. The operating method according to claim 17,
wherein the semiconductor integrated circuit including the serial ATA interface unit is coupled between a storage disc device and a host device, and
wherein, while the semiconductor integrated circuit reads a read signal from the storage disc device and supplies read data to the host device, the semiconductor integrated circuit receives write data from the host device and supplies a write signal to the storage disc device.

19. A semiconductor on-chip phase-locked loop circuit comprising:
a comparator configured to output a phase-compared output signal reflective of a lead or lag in phase of a feedback signal relative to a reference signal;
a loop attenuator configured to output a charge pump drive output signal in response to said phase-compared output signal produced by the comparator;
a charge pump configured to output a charge/discharge signal in response to the charge pump drive output signal produced by the loop attenuator;
a loop filter configured to output a control voltage in response to the charge/discharge signal produced by the charge pump;
a voltage-controlled oscillator configured to output an oscillation output signal in response to the control voltage produced by a loop filter; and
a divider configured to receive and divide the oscillation output signal outputted from the voltage controlled oscillator to produce said feedback signal;
wherein:
the loop attenuator comprises a one-shot circuit configured to output a one-shot pulse output signal which is applied to the charge pump as the charge pump drive output signal, the one-shot pulse output signal being produced in response to the loop attenuator receiving a phase-compared signal of constant value and sufficient duration reflecting a sufficiently continuous phase lead or phase lag of the feedback signal relative to the reference signal.

20. The semiconductor on-chip phase-locked loop circuit according to claim 19, wherein the loop attenuator further comprises:
a sampling circuit configured to receive the phase-compared signal and output a sampled version of phase-compared signal; and
a counter configured to count the number of samples in the sampled version of the phase-compared signal and output a countup completion output signal upon counting a predetermined number of samples, the countup completion output signal being provided to the one-shot circuit.

21. The semiconductor on-chip phase-locked loop circuit according to claim 20;
wherein the one-shot pulse output signal has a pulse width approximately equal to that of a sampling pulse of the loop attenuator;
wherein the one-shot pulse generator comprises a first flip-flop, a second flip-flop, an inverter, an exclusive-OR circuit and an AND circuit,
wherein the countup completion output signal outputted from the counter is supplied to a data input terminal of the first flip-flop and a data input terminal of the second flip-flop,
wherein the sampling pulse is supplied to a clock input terminal of the first flip-flop and an input terminal of the inverter,
wherein an inverted sampling pulse outputted from an output terminal of the inverter is supplied to a clock input terminal of the second flip-flop,
wherein output data of the first flip-flop and output data of the second flip-flop are respectively supplied to first and second input terminals of the exclusive-OR circuit, and
wherein the countup completion output signal and an output signal of the exclusive-OR circuit are respectively supplied to first and second input terminals of the AND circuit, and the one-shot pulse output signal is outputted from an output signal of the AND circuit.

22. The semiconductor on-chip phase-locked loop circuit according to claim 20, further including a controller which outputs a counter control signal supplied to the counter during a predetermined lapse period after completion of a low-power standby state;
and wherein the counter outputs the countup completion output signal to the one-shot circuit during the predetermined lapse period, even if the predetermined number of samples have not been counted.

23. The semiconductor on-chip phase-locked loop circuit according to claim 22, further comprising:
a modulator coupled to the divider, wherein the divider changes between division numbers different in value in response to an output of the modulator, so that the phase locked loop circuit is operated in an operation mode of a fractional phase-locked loop (PLL) in which an average division number of the divider is the sum of an integral part and a fractional part.

24. A method of operating an on-chip phase-locked loop circuit,
the on-chip phase-locked loop circuit comprising:
a comparator configured to output a phase-compared output signal reflective of a lead or lag in phase of a feedback signal relative to a reference signal;
a loop attenuator configured to output a charge pump drive output signal in response to said phase-compared output signal produced by the comparator, and
a charge pump configured to output a charge/discharge signal in response to the charge pump drive output signal produced by the loop attenuator;
a loop filter configured to output a control voltage in response to the charge/discharge signal produced by the charge pump;
a voltage-controlled oscillator configured to output an oscillation output signal in response to the control voltage produced by a loop filter; and
a divider configured to receive and divide the oscillation output signal outputted from the voltage controlled oscillator to produce said feedback signal;
the method comprising:
outputting, by the attenuator, a one-shot pulse output signal which is applied to the charge pump as the charge pump drive output signal, the one-shot pulse output signal being produced in response to the loop attenuator receiving a phase-compared signal of constant value and sufficient duration reflecting a sufficiently continuous phase lead or phase lag of the feedback signal relative to the reference signal.

25. The method of operating an on-chip phase-locked loop circuit according to claim 24, further comprising, prior to outputting the one-shot pulse signal:
- sampling the phase-compared signal;
- counting the number of samples in the sampled phase-compared signal; and
- outputting a countup completion output signal upon counting a predetermined number of samples to trigger the creation one-shot pulse output signal.

* * * * *